(12) United States Patent
Cho et al.

(10) Patent No.: US 12,268,055 B2
(45) Date of Patent: Apr. 1, 2025

(54) DISPLAY PANEL AND ELECTRONIC DEVICE INCLUDING PORTION OF OVERCOAT LAYER BETWEEN LIGHT-BLOCKING PORTION AND COLOR FILTER

(71) Applicant: Samsung Display Co., Ltd., Yongin-si (KR)

(72) Inventors: Seongmin Cho, Yongin-si (KR); Beohmrock Choi, Yongin-si (KR); Chiwook An, Yongin-si (KR); Choongyoul Im, Yongin-si (KR); Nakcho Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 267 days.

(21) Appl. No.: 17/444,547

(22) Filed: Aug. 5, 2021

(65) Prior Publication Data

US 2022/0093708 A1   Mar. 24, 2022

(30) Foreign Application Priority Data

Sep. 24, 2020   (KR) .................. 10-2020-0123994

(51) Int. Cl.
*H10K 59/122* (2023.01)
*G06F 3/041* (2006.01)
(Continued)

(52) U.S. Cl.
CPC ......... *H10K 59/122* (2023.02); *G06F 3/0412* (2013.01); *G06F 3/0446* (2019.05);
(Continued)

(58) Field of Classification Search
CPC .................. H10K 59/126; H10K 59/12
See application file for complete search history.

(56) References Cited

U.S. PATENT DOCUMENTS

| 8,106,583 B2 | 1/2012 | Shin et al. |
| 8,664,021 B2 | 3/2014 | Kim et al. |
(Continued)

FOREIGN PATENT DOCUMENTS

| KR | 10-2018-0014905 A | 2/2018 |
| KR | 10-2018-0025431 A | 3/2018 |
(Continued)

*Primary Examiner* — Lauren Nguyen
(74) *Attorney, Agent, or Firm* — Womble Bond Dickinson (US) LLP

(57) ABSTRACT

A display panel includes: first and second pixel circuits on a substrate; first and second pixel electrodes electrically connected to the first and second pixel circuits, respectively; a pixel defining layer having openings overlapping with the first and second pixel electrodes, respectively; a first emission layer on the first pixel electrode; a second emission layer on the second pixel electrode; an opposite electrode on the first emission layer and the second emission layer; and an anti-reflection layer on the opposite electrode. The anti-reflection layer includes: a light-blocking portion corresponding to an area between the openings of the pixel defining layer; a first color filter overlapping with the first emission layer; a second color filter overlapping with the second emission layer; and an overcoat layer including a portion located in a separation space between the light-blocking portion and at least one of the first color filter or the second color filter.

18 Claims, 28 Drawing Sheets

(51) Int. Cl.
*G06F 3/044* (2006.01)
*H10K 50/84* (2023.01)
*H10K 50/86* (2023.01)
*H10K 59/121* (2023.01)
*H10K 59/131* (2023.01)
*H10K 59/38* (2023.01)
*H10K 59/40* (2023.01)

(52) U.S. Cl.
CPC .......... *H10K 50/84* (2023.02); *H10K 50/865* (2023.02); *H10K 59/1213* (2023.02); *H10K 59/1216* (2023.02); *H10K 59/131* (2023.02); *H10K 59/38* (2023.02); *H10K 59/40* (2023.02); *G06F 2203/04112* (2013.01)

(56) References Cited

U.S. PATENT DOCUMENTS

| | | | |
|---|---|---|---|
| 8,866,170 | B2 | 10/2014 | Moon et al. |
| 10,236,333 | B2 | 3/2019 | Kim |
| 10,459,557 | B2 | 10/2019 | Hong et al. |
| 10,553,827 | B2 | 2/2020 | Jang et al. |
| 10,741,627 | B2 | 8/2020 | Jung et al. |
| 2006/0232529 | A1* | 10/2006 | Midorikawa ..... G02F 1/133514 345/87 |
| 2017/0090223 | A1* | 3/2017 | Kim ................. G02F 1/1309 |
| 2018/0095570 | A1* | 4/2018 | Hong .................. G06F 3/0412 |
| 2018/0122868 | A1 | 5/2018 | Kim et al. |
| 2018/0182819 | A1* | 6/2018 | Jo ..................... G06F 3/0412 |
| 2019/0252470 | A1 | 8/2019 | Lee |
| 2020/0258953 | A1 | 8/2020 | Bae et al. |

FOREIGN PATENT DOCUMENTS

| | | |
|---|---|---|
| KR | 10-2018-0036847 A | 4/2018 |
| KR | 10-2018-0047559 A | 5/2018 |
| KR | 10-2018-0074985 A | 7/2018 |
| KR | 10-2019-0086605 A | 7/2019 |
| KR | 10-2019-0095630 A | 8/2019 |
| KR | 10-2020-0069082 A | 6/2020 |
| KR | 10-2020-0099251 A | 8/2020 |

* cited by examiner

DISPLAY PANEL AND ELECTRONIC DEVICE INCLUDING PORTION OF OVERCOAT LAYER BETWEEN LIGHT-BLOCKING PORTION AND COLOR FILTER

CROSS-REFERENCE TO RELATED APPLICATION

This application claims priority to and the benefit of Korean Patent Application No. 10-2020-0123994, filed on Sep. 24, 2020, in the Korean Intellectual Property Office, the entire disclosure of which is incorporated by reference herein.

BACKGROUND

1. Field

Aspects of one or more embodiments of the present disclosure relate to a display panel, and an electronic device including the display panel.

2. Description of Related Art

Display panels have been used for various suitable purposes. Also, because the thickness and weight of the display panels have been reduced, a utilization range of the display panels has increased.

In the display panels, while an area occupied by a display area has been increased, various functions have been added or linked to the display panels. As a method of adding various functions, while increasing an area, research into a display panel having an area for providing various suitable functions other than an image display in a display area has been conducted.

The above information disclosed in this Background section is for enhancement of understanding of the background of the present disclosure, and therefore, it may contain information that does not constitute prior art.

SUMMARY

Various suitable components, for example, such as a camera or a sensor, may be arranged in a display panel to add various suitable functions. Such components may be arranged to overlap with a display area to secure a large display area. As a method of arranging the components, a display panel may include a transmission area through which light or sound may pass. One or more embodiments of the present disclosure are directed to a display panel having the above-described structure, and an electronic device including the display panel.

Additional aspects and features of the present disclosure will be set forth, in part, in the description which follows, and in part, will be apparent from the description, or may be learned by practicing one or more of the presented embodiments of the present disclosure.

According to one or more embodiments of the present disclosure, a display panel includes: a first pixel circuit and a second pixel circuit on a substrate, each of the first and second pixel circuits including a transistor, a storage capacitor, and a conductive line; a first pixel electrode electrically connected to the first pixel circuit; a second pixel electrode adjacent to the first pixel electrode, and electrically connected to the second pixel circuit; a pixel defining layer covering edges of the first pixel electrode and edges of the second pixel electrode, and having openings overlapping with the first and second pixel electrodes, respectively; a first emission layer on the first pixel electrode; a second emission layer on the second pixel electrode; an opposite electrode on the first emission layer and the second emission layer; and an anti-reflection layer on the opposite electrode. The anti-reflection layer includes: a light-blocking portion corresponding to an area between the opening of the pixel defining layer overlapping with the first pixel electrode and the opening of the pixel defining layer overlapping with the second pixel electrode; a first color filter overlapping with the first emission layer; a second color filter overlapping with the second emission layer; and an overcoat layer including a portion located in a separation space between the light-blocking portion and at least one of the first color filter or the second color filter.

In an embodiment, the portion of the overcoat layer may overlap with the pixel defining layer, and each of the overcoat layer and the pixel defining layer may include a transparent organic insulating material.

In an embodiment, the display panel may further include an input sensing layer between the opposite electrode and the anti-reflection layer, and the portion of the overcoat layer may be in direct contact with an upper surface of the input sensing layer.

In an embodiment, the input sensing layer may include a touch electrode including a metal line overlapping with the light-blocking portion.

In an embodiment, the input sensing layer may further include a touch insulating layer between the metal line and the light-blocking portion, the touch insulating layer including an inorganic insulating material.

In an embodiment, a width of the metal line may be less than a width of the light-blocking portion.

In an embodiment, the display panel may further include a plurality of insulating layers between the substrate and the pixel defining layer. A stacked part between a top surface of the substrate and a top surface of the pixel defining layer may overlap with the portion of the overcoat layer, and the stacked part may include only the plurality of insulating layers and the pixel defining layer.

In an embodiment, the display panel may further include a first light-emitting diode including the first pixel electrode, the first emission layer, and the opposite electrode, and the separation space may at least partially surround an emission area of the first light-emitting diode in a plan view.

According to one or more example embodiments of the present disclosure, an electronic device includes: a display panel including a first display area, and a second display area; and a component overlapping with the second display area of the display panel. The second display area of the display panel includes: a substrate; a first light-emitting diode and a second light-emitting diode adjacent to each other on the substrate; a pixel defining layer covering edges of a first pixel electrode in the first light-emitting diode and edges of a second pixel electrode in the second light-emitting diode, the pixel defining layer having openings overlapping with the first pixel electrode and the second pixel electrode, respectively; an encapsulation layer on the first light-emitting diode and the second light-emitting diode; and an anti-reflection layer on the encapsulation layer. The anti-reflection layer includes: a light-blocking portion between the opening of the pixel defining layer overlapping with the first pixel electrode and the opening of the pixel defining layer overlapping with the second pixel electrode in a plan view; a first color filter overlapping with the first light-emitting diode; a second color filter overlapping with the second light-emitting diode; and an overcoat layer including a portion in a separation space between the light-blocking portion and at least one of the first color filter or the second color filter.

In an embodiment, the portion of the overcoat layer may overlap with the pixel defining layer, and each of the overcoat layer and the pixel defining layer may include a transparent organic insulating material.

In an embodiment, the electronic device may further include an input sensing layer between the encapsulation layer and the anti-reflection layer, the input sensing layer including touch electrodes.

In an embodiment, the portion of the overcoat layer may be in direct contact with an upper surface of the input sensing layer.

In an embodiment, each of the touch electrodes may include a metal line having a mesh structure, and the light-blocking portion may cover the metal line.

In an embodiment, the input sensing layer may further include a touch insulating layer between the metal line and the light-blocking portion, the touch insulating layer including an inorganic insulating material.

In an embodiment, the electronic device may further include a plurality of insulating layers between the substrate and the pixel defining layer. A stacked part between a top surface of the substrate and a top surface of the pixel defining layer may overlap with the portion of the overcoat layer, and the stacked part may include only the plurality of insulating layers and the pixel defining layer.

In an embodiment, a number of light-emitting diodes at the first display area may be equal to a number of light-emitting diodes at the second display area for the same sized unit area.

According to one or more embodiments of the present disclosure, an electronic device includes: a display panel including a first display area and a second display area; and a component overlapping with the second display area of the display panel. The second display area of the display panel includes: a substrate; a first light-emitting diode and a second light-emitting diode adjacent to each other on the substrate; a pixel defining layer covering edges of a first pixel electrode in the first light-emitting diode and edges of a second pixel electrode in the second light-emitting diode, and having openings overlapping with the first pixel electrode and the second pixel electrode, respectively; an encapsulation layer on the first light-emitting diode and the second light-emitting diode; and an anti-reflection layer on the encapsulation layer. The anti-reflection layer includes: a light-blocking portion between an opening of the pixel defining layer overlapping with the first pixel electrode and an opening of the pixel defining layer overlapping with the second pixel electrode in a plan view; a first color filter overlapping with the first light-emitting diode; a second color filter overlapping with the second light-emitting diode; and an overcoat layer on the first color filter and the second color filter. The component is configured to emit or receive light passing through the first color filter.

In an embodiment, a first distance between an emission area of the first light-emitting diode and the light-blocking portion may be greater than a second distance between an emission area of the second light-emitting diode and the light-blocking portion.

In an embodiment, the electronic device may further include an input sensing layer between the encapsulation layer and the anti-reflection layer, the input sensing layer including touch electrodes.

In an embodiment, each of the touch electrodes may include a metal line having a mesh structure, and the light-blocking portion may cover the metal line.

In an embodiment, the input sensing layer may further include a touch insulating layer between the metal line and the light-blocking portion, the touch insulating layer including an inorganic insulating material.

In an embodiment, a number of light-emitting diodes at the first display area may be equal to a number of light-emitting diodes at the second display area for the same sized unit area.

The above and other aspects and features of the present disclosure will become better understood through the accompanying drawings, the detailed description, and the claims and their equivalents.

BRIEF DESCRIPTION OF THE DRAWINGS

The above and other aspects and features of the present disclosure will become more apparent to those skilled in the art from the following detailed description of the example embodiments with reference to the accompanying drawings, in which.

DETAILED DESCRIPTION

Figure 1:
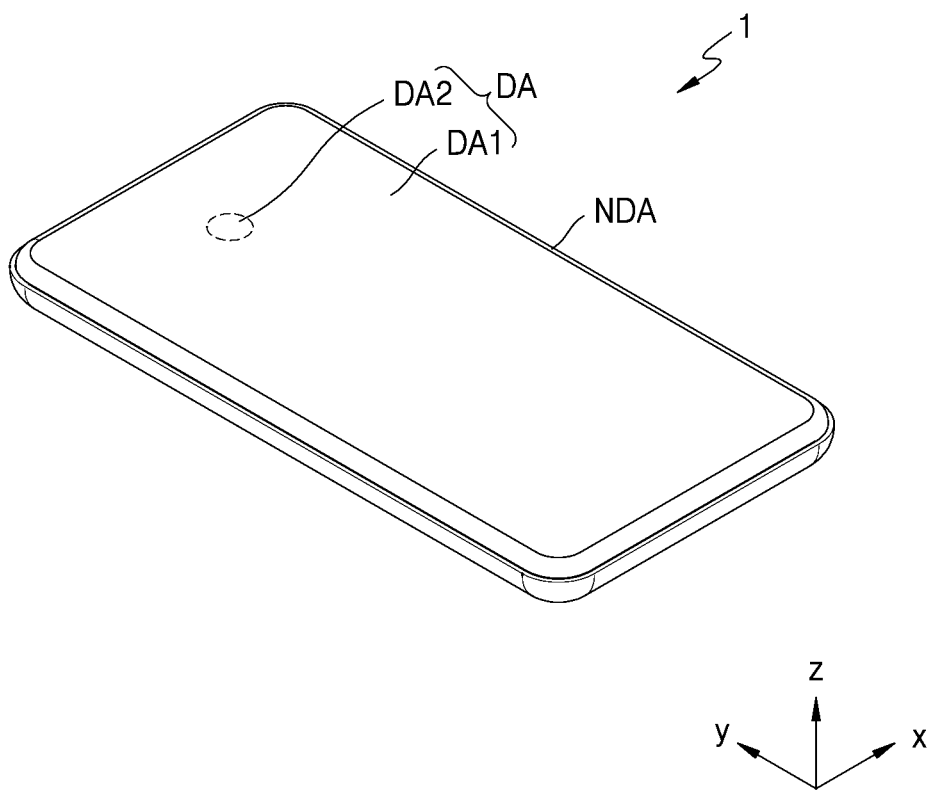
FIG. 1 is a perspective view of an electronic appliance including a display panel according to an embodiment.

Hereinafter, example embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, redundant descriptions thereof may not be repeated.

When a certain embodiment may be implemented differently, a specific process order may be performed differently from the described order. For example, two consecutively described processes may be performed at the same or substantially at the same time, or may be performed in an order opposite to the described order.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, when layers, areas, elements, and the like are referred to as being "electrically connected to" another layer, area, element, and the like, they may be directly electrically connected to each other, or one or more intervening layers, areas, elements, and the like may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a perspective view of an electronic appliance 1 including a display panel according to an embodiment.

The electronic device 1 according to an embodiment is a device for displaying a video and/or still images, and may be used as a portable electronic device, for example, such as a mobile phone, a smartphone, a tablet personal computer (PC), a mobile communication terminal, an electronic notebook, an electronic book, a portable multimedia player (PMP), a navigation terminal, an ultra-mobile PC (UMPC), and/or the like, and also as a display screen in various suitable products, for example, such as a television, a laptop computer, a monitor, a billboard, an internet of things (IoT) device, and/or the like. Also, the electronic device 1 may be used in wearable devices, for example, such as a smartwatch, a watch phone, a glasses-type display, a head-mounted display (HMD), and/or the like. Also, the electronic device 1 may be used in a dashboard of a vehicle, a center information display in a center fascia or dashboard of a vehicle, a rear-view mirror display that replaces a side-view mirror of a vehicle, a display in a rear side of a front seat as an entertainment for the back seat in a vehicle, and/or the like. FIG. 1 shows that the electronic device 1 is used as a smartphone, for convenience of description and illustration, but the present disclosure is not limited thereto.

Referring to FIG. 1, the electronic device 1 may include a display area DA, and a non-display area NDA at (e.g., in or on) an outer portion of the display area DA. The electronic device 1 may provide images via arrays of a plurality of pixels that are two-dimensionally arranged at (e.g., in or on) the display area DA.

The non-display area NDA does not provide images, and may entirely surround (e.g., around a periphery of) the display area DA. Drivers and the like for providing electrical signals or electric power to the pixels at (e.g., in or on) the display area DA may be located at (e.g., in or on) the non-display area NDA. The non-display area NDA may include a pad to which an electronic device, a printed circuit board, and/or the like may be electrically connected.

The display area DA may include a first display area DA1, and a second display area DA2. The second display area DA2 is an area at (e.g., in or on) which a component for adding various suitable functions to the electronic device 1 is arranged, and may correspond to a component area.

Figure 2A:
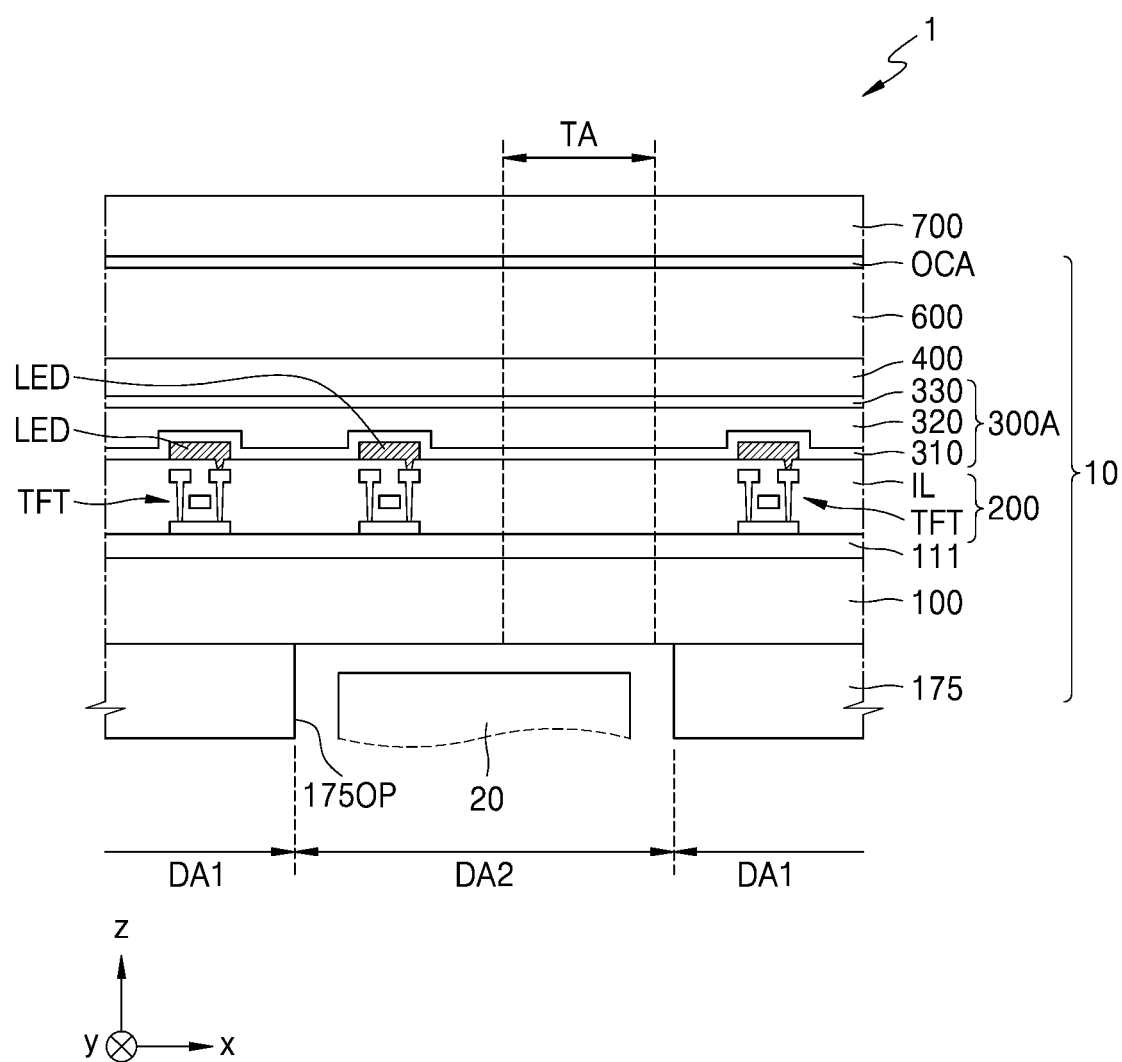
FIGS. 2A-2B are cross-sectional views partially showing an electronic appliance according to one or more embodiments.
Figure 2B:
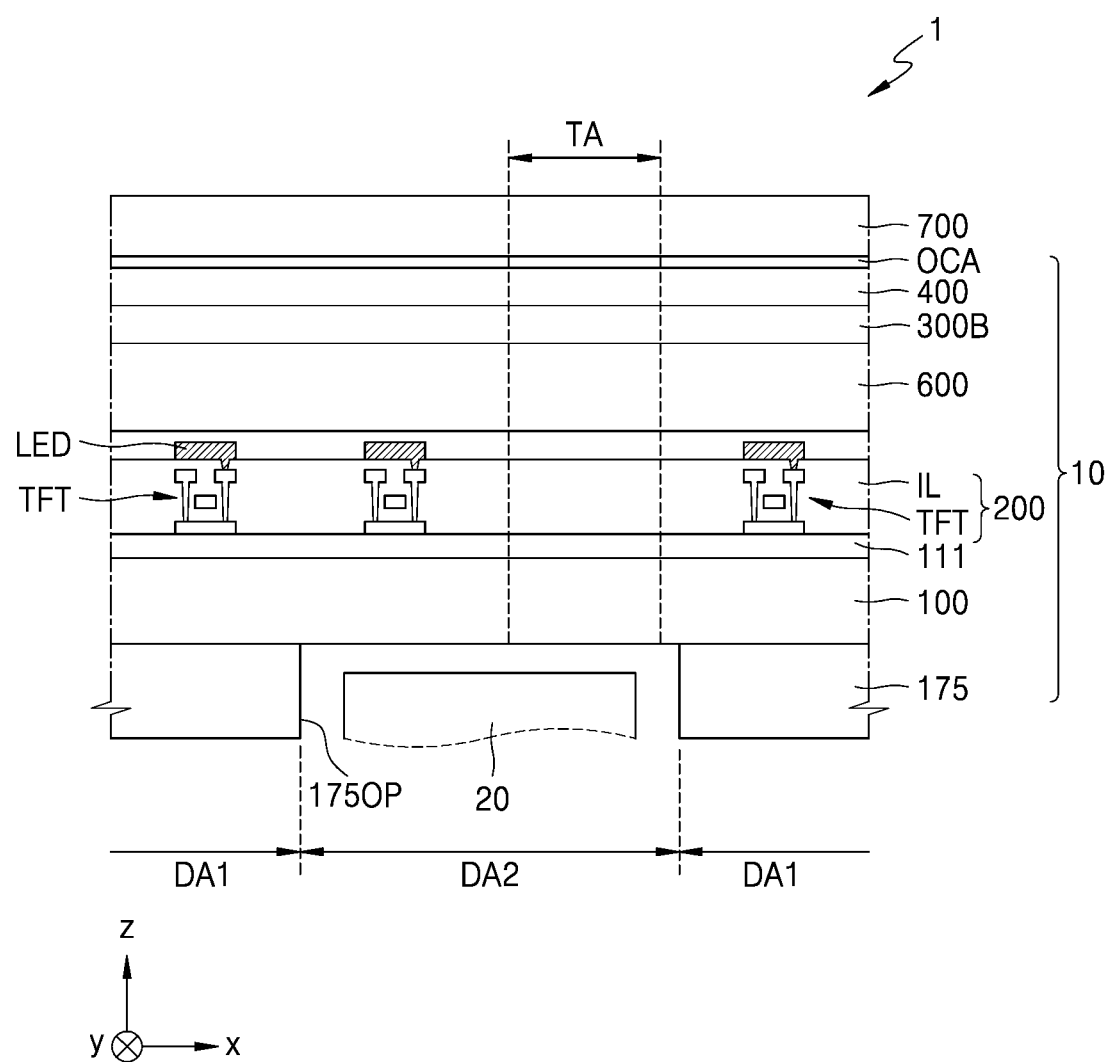

FIGS. 2A and 2B are cross-sectional views partially showing the electronic device 1 according to one or more embodiments.

Referring to FIGS. 2A and 2B, the electronic device 1 may include a display panel 10, and a component 20 overlapping with the display panel 10. The component 20 may be at (e.g., in or on) the second display area DA2.

The display panel 10 may include a substrate 100, a display layer 200 on the substrate 100, an encapsulation member (e.g., 300A or 300B) on the display layer 200, an input sensing layer 400, an anti-reflection layer 600, and a window 700.

The substrate 100 may include glass or a polymer resin. For example, the substrate 100 may include polyethersulfone, polyacrylate, polyether imide, polyethylene naphthalate, polyethylene terephthalate, polyphenylene sulfide, polyarylate, polyimide, polycarbonate, cellulose acetate propionate, and/or the like. The substrate 100 including the polymer resin may be flexible, rollable, and/or bendable. The substrate 100 may have a multi-layered structure including a layer including the polymer resin described above, and an inorganic layer.

The display layer 200 is on a front surface of the substrate 100, and a lower protective film 175 may be on a rear surface of the substrate 100. The lower protective film 175 may be attached to the rear surface of the substrate 100. An adhesive layer may be between the lower protective film 175 and the substrate 100. As another example, the lower protective film 175 may be directly on the rear surface of the substrate 100, and in this case, an adhesive layer may not be provided between the lower protective film 175 and the substrate 100.

The lower protective film 175 may support and protect the substrate 100. The lower protective film 175 may include an opening 175OP corresponding to the second display area DA2. The lower protective film 175 may include an organic insulating material, for example, such as polyethylene terephthalate (PET) or polyimide (PI).

The display layer 200 may include a plurality of pixels. Each of the pixels may include a display element, and may emit red light, green light, or blue light. The display element may include a light-emitting diode LED. In an embodiment, the light-emitting diode LED may include an organic light-emitting diode including an organic emission layer. In another embodiment, the light-emitting diode LED may include an inorganic light-emitting diode including an inorganic material. The inorganic light-emitting diode may include a PN junction diode including one or more inorganic material semiconductor-based materials. When a voltage is applied to the PN junction diode in a forward direction, holes and electrons are injected, and energy generated by recombination of the holes and electrons is converted into light energy to emit light having a desired color (e.g., a predetermined or certain color). The inorganic light-emitting diode may have a width in a range of a few micrometers to hundreds of micrometers, and in some embodiments, the inorganic light-emitting diode may be referred to as a micro-LED. In some embodiments, the inorganic light-emitting diode may have a width in a range of a few nanometers to hundreds of nanometers. In some embodiments, the light-emitting diode LED may include a quantum dot light-emitting diode. The emission layer in the light-emitting diode LED may include an organic material, an inorganic material, quantum dots, an organic material and quantum dots, or an inorganic material and quantum dots.

The light-emitting diode LED may be electrically connected to a transistor TFT arranged thereunder. In this regard, FIGS. 2A and 2B show that a buffer layer 111 is on the substrate, the transistor TFT is on the buffer layer 111, and the light-emitting diode LED is electrically connected to the transistor TFT via a contact hole in an insulating layer IL covering the transistor TFT.

In some embodiments, the transistor TFT and the light-emitting diode LED that is electrically connected to the transistor TFT may be located at (e.g., in or on) the first display area DA1 and the second display area DA2, respectively.

The second display area DA2 may include a transmission area TA. The transmission area TA may be an area through which light emitted from and/or emitted towards the component 20 passes (e.g., is transmitted). In the display panel, a transmittance of the transmission area TA may be about 30% or greater, about 40% or greater, about 50% or greater, about 60% or greater, about 70% or greater, about 75% or greater, about 80% or greater, about 85% or greater, or about 90% or greater.

The display layer 200 may be encapsulated by the encapsulation member. In some embodiments, the encapsulation member may include the encapsulation layer 300A as shown in FIG. 2A. The encapsulation layer 300A may include at least one inorganic encapsulation layer and at least one organic encapsulation layer. In an embodiment, the encapsulation layer 300A may include first and second inorganic encapsulation layers 310 and 330, and an organic encapsulation layer 320 between the first and second inorganic encapsulation layers 310 and 330.

In some embodiments, the encapsulation member may include an encapsulation substrate 300B as shown in FIG. 2B. The encapsulation substrate 300B may face the substrate 100 with the display layer 200 therebetween. The encapsulation substrate 300B may include glass. A sealant is between the substrate 100 and the encapsulation substrate 300B, and the sealant may be at (e.g., in or on) the non-display area NDA described above with reference to FIG. 1. The sealant at (e.g., in or on) the non-display area NDA may surround (e.g., around a periphery of) the display area DA to prevent or substantially prevent moisture from infiltrating through side surfaces of the display area DA.

The input sensing layer 400 may be on the encapsulation layer 300A or the encapsulation substrate 300B. The input sensing layer 400 may obtain coordinate information according to an external input (e.g., a touch event of a finger or an object such as a stylus pen). The input sensing layer 400 may include a touch electrode, and trace lines connected to the touch electrode. The input sensing layer 400 may sense the external input by a mutual capacitance method or a self-capacitance method.

The anti-reflection layer 600 may be on the encapsulation layer 300A as shown in FIG. 2A, or may be under the encapsulation substrate 300B as shown in FIG. 2B. The anti-reflection layer 600 may reduce the reflectivity of light (e.g., of external light) that is incident into the display panel from outside. The anti-reflection layer 600 may include a filter plate including a light-blocking portion, and color filters. The filter plate may include the color filters, the light-blocking portion, and an overcoat layer at (e.g., in or on) each of the pixels.

The window 700 is on the anti-reflection layer 600, and may be connected to the anti-reflection layer 600 via an adhesive layer, for example, such as an optical clear adhesive (OCA). The window 700 may include a glass material or a plastic material. The plastic material may include polyethersulfone, polyacrylate, polyether imide, polyethylene naphthalate, polyethylene terephthalate, polyphenylene sulfide, polyarylate, polyimide, polycarbonate, cellulose acetate propionate, and/or the like.

The component 20 may overlap with the second display area DA2 of the display area DA. The component 20 may include a proximity sensor, an illuminance sensor, an iris sensor, a face recognition sensor, and/or a camera (e.g., an image sensor). The component 20 may utilize light. For example, the component 20 may emit and/or receive light in an infrared ray band, an ultraviolet ray band, or a visible ray band. The proximity sensor using the infrared ray may detect an object adjacent to an upper surface of the electronic device 1, and the illuminance sensor may sense a brightness of the light incident into the upper surface of the electronic device 1. Also, the iris sensor may capture an image of an iris of a person on the upper surface of the electronic device 1, and the camera may receive light from an object on the upper surface of the electronic device 1. The component 20 overlapping with the second display area DA2 of the display panel 10 is not limited to the proximity sensor, the illuminance sensor, the iris sensor, the face recognition sensor, and/or the image sensor, or in other words, various suitable sensors may be provided as the component 20.

FIGS. 3A to 3H are plan views of the display panel 10 according to one or more embodiments.

Figure 3A:
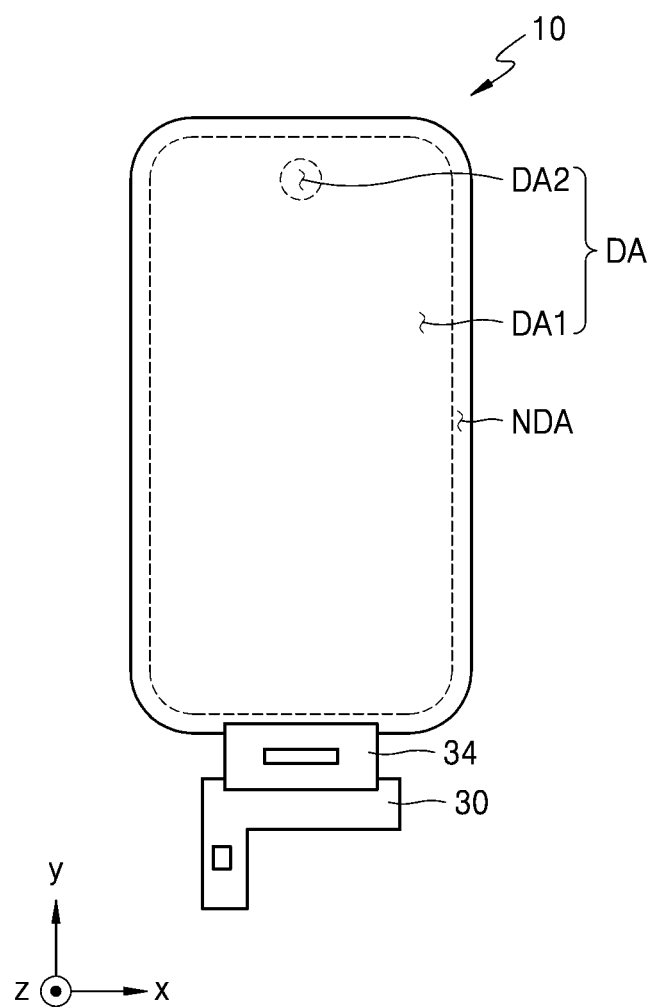
FIGS. 3A-3H are plan views of a display panel according to one or more embodiments.

FIGS. 3A to 3H show various suitable example arrangements of the first and second display areas DA1 and DA2. The display area DA may be entirely surrounded (e.g., around a periphery thereof) by the non-display area NDA. A pad portion is located at (e.g., in or on) the non-display area NDA, and as shown in FIG. 3A, a display circuit board 30 may be electrically connected to the pad portion of the non-display area NDA via a flexible film 34 of or connected to the non-display area NDA. The display circuit board 30 may include a flexible printed circuit board (FPCB) that is bendable, a rigid printed circuit board (PCB) that is rigid and hardly bendable, or a composite printed circuit board including both the rigid PCB and the FPCB.

The display area DA may include the first display area DA1 and the second display area DA2. The second display area DA2 may be a kind of component area at (e.g., in or on) which the component 20 is provided, as described above.

Referring to FIGS. 3A to 3E, the second display area DA2 may be located within (e.g., inside) the first display area DA1, and may be entirely surrounded (e.g., around a periphery thereof) by the first display area DA1. The second display area DA2 may have a circular shape in a plan view (e.g., a view from a direction that is perpendicular to or substantially perpendicular to a top surface of the relevant element or layer). As another example, the second display area DA2 may have a polygonal shape in a plan view, for example, such as a quadrilateral shape, or may have an elliptical shape in a plan view.

Figure 3B:
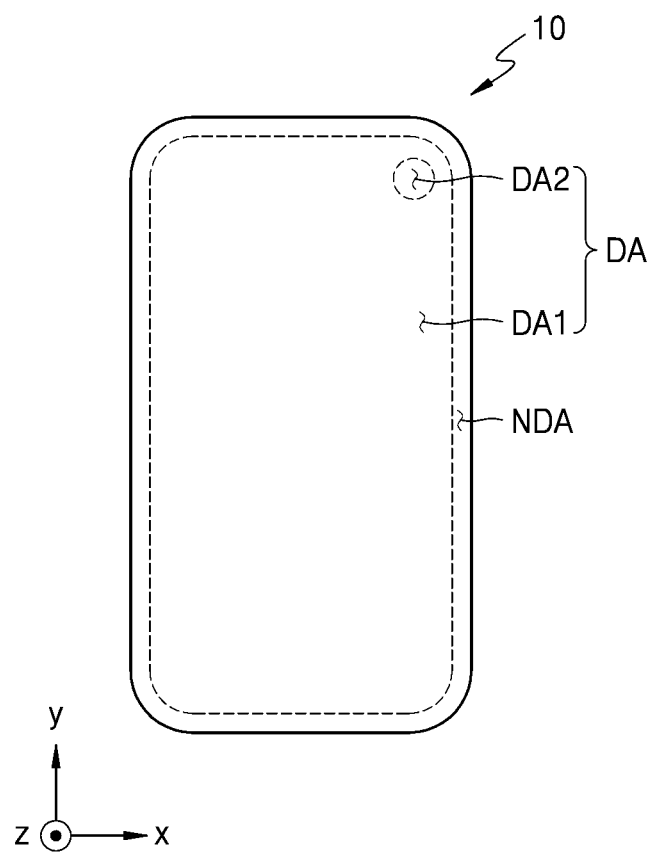
Figure 3C:
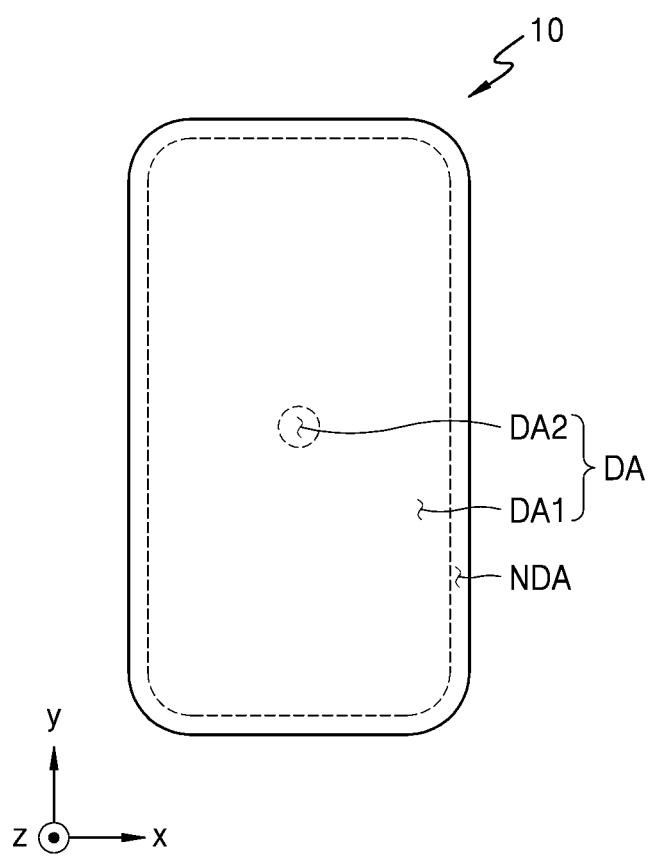

The second display area DA2 may be located at various suitable locations. As shown in FIG. 3A, the second display area DA2 may be located at (e.g., in or on) an upper central portion of the display area DA in a plan view. As shown in FIG. 3B, the second display area DA2 may be located at (e.g., in or on) an upper right portion of the display area DA in a plan view. As another example, as shown in FIG. 3C, the second display area DA2 may be located at (e.g., in or on) a central portion of the display area DA in a plan view, and in this case, when the component 20 arranged corresponding to the second display area DA2 includes a camera, the eyes of a user who is taking a selfie or making a video call may be naturally focused on the camera.

As used in the specification herein, in a plan view, the left, right, up, and down directions denote the corresponding directions when the electronic device 1 is viewed from a direction that is perpendicular to or substantially perpendicular to a surface (e.g., a front surface or a top surface) of the display panel 10. For example, the left direction denotes a −x direction, the right direction denotes a +x direction, the upper direction denotes a +y direction, and the lower direction denotes a −y direction. FIG. 3A shows one second display area DA2, but in other embodiments, there may be a plurality of second display areas DA2.

Figure 3D:
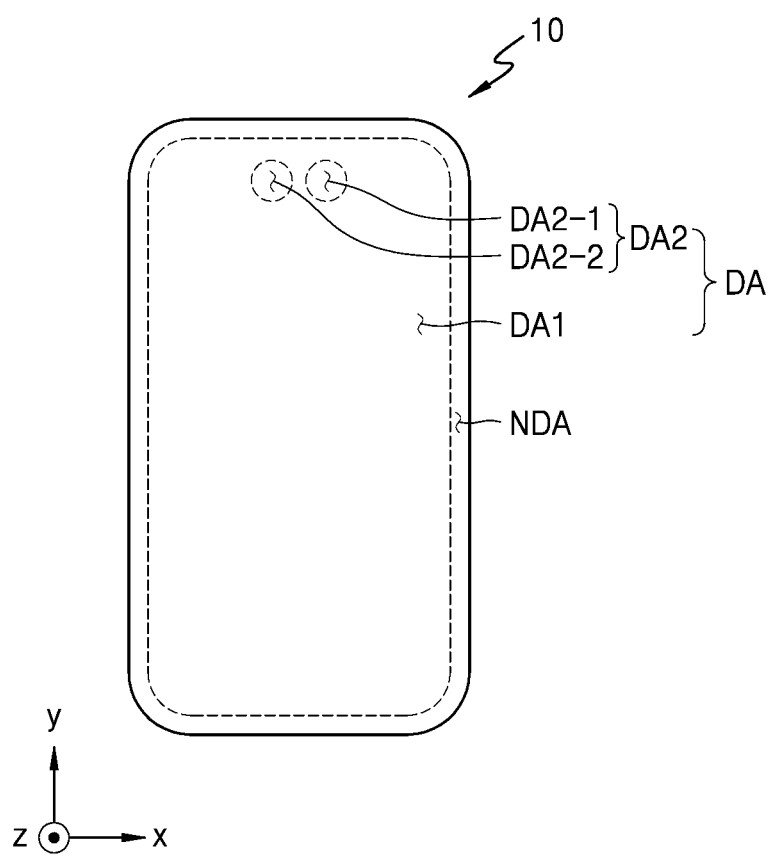
Figure 3E:
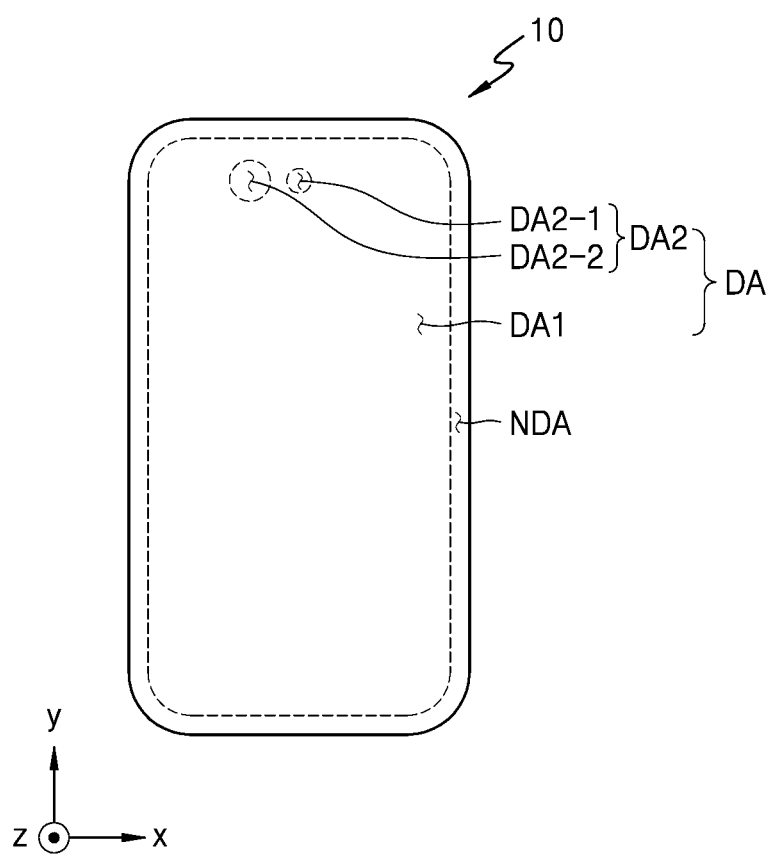

As shown in FIGS. 3D and 3E, the second display area DA2 may include two or more sub-display areas that are adjacent to one another, and in an embodiment, FIGS. 3D and 3E show that the second display area DA2 includes a first sub-display area DA2-1, and a second sub-display area DA2-2. The first sub-display area DA2-1 and the second sub-display area DA2-2 may be arranged to be adjacent to each other in the x-direction as shown in FIGS. 3D and 3E, or may be arranged to be adjacent to each other in the y-direction. The first sub-display area DA2-1 and the second sub-display area DA2-2 may have the same or substantially the same sizes (e.g., may have identical sizes) as each other as shown in FIG. 3D, or may have different sizes from each other as shown in FIG. 3E.

Figure 3F:
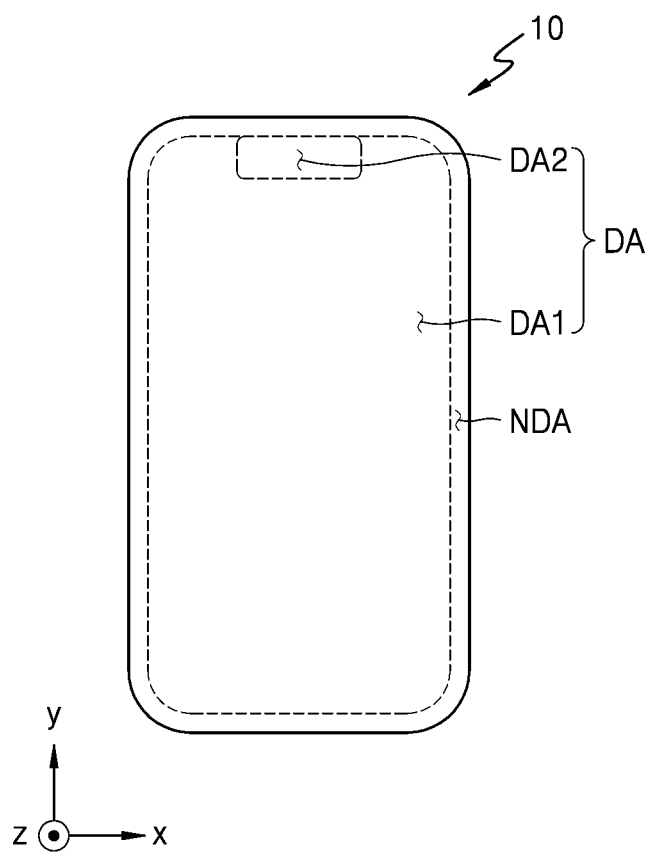
Figure 3G:
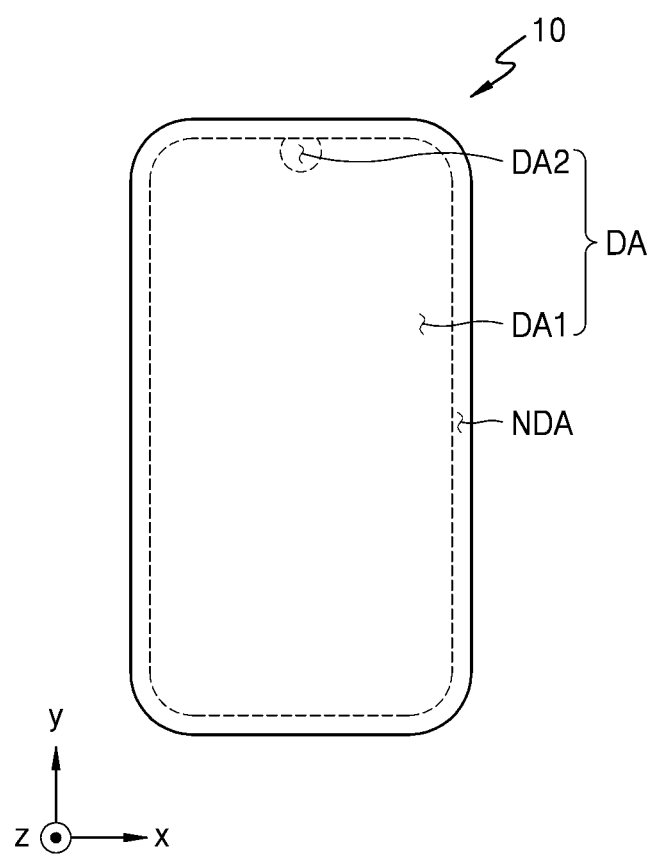
Figure 3H:
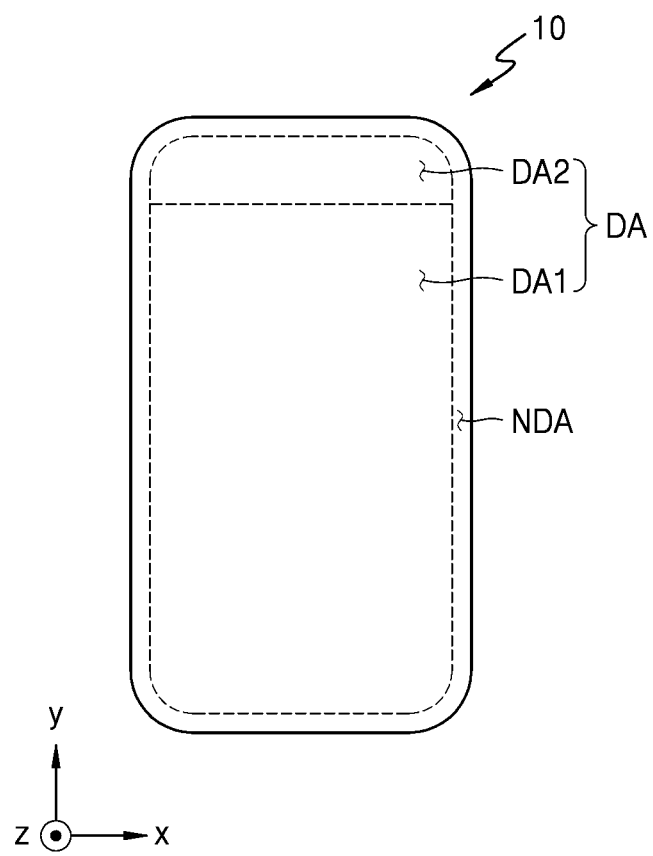

The second display area DA2 is located at a side (e.g., at an end) of the first display area DA1 as shown in FIGS. 3F to 3H, and may be partially surrounded (e.g., around a periphery thereof) by the first display area DA1, such that a side (e.g., an edge) of the second display area DA2 may be adjacent to the non-display area NDA.

The second display area DA2 may have a notch-type shape that is concave toward the center of the display area DA from one side of the display area DA, as shown in FIGS. 3F and 3G. The notch may have various suitable shapes in a plan view (e.g., a quadrilateral shape, a semicircular shape, a semi-elliptical shape, and/or the like). As another example, the second display area DA2 may have a bar-type shape extending in the x-direction as shown in FIG. 3H.

Figure 4:
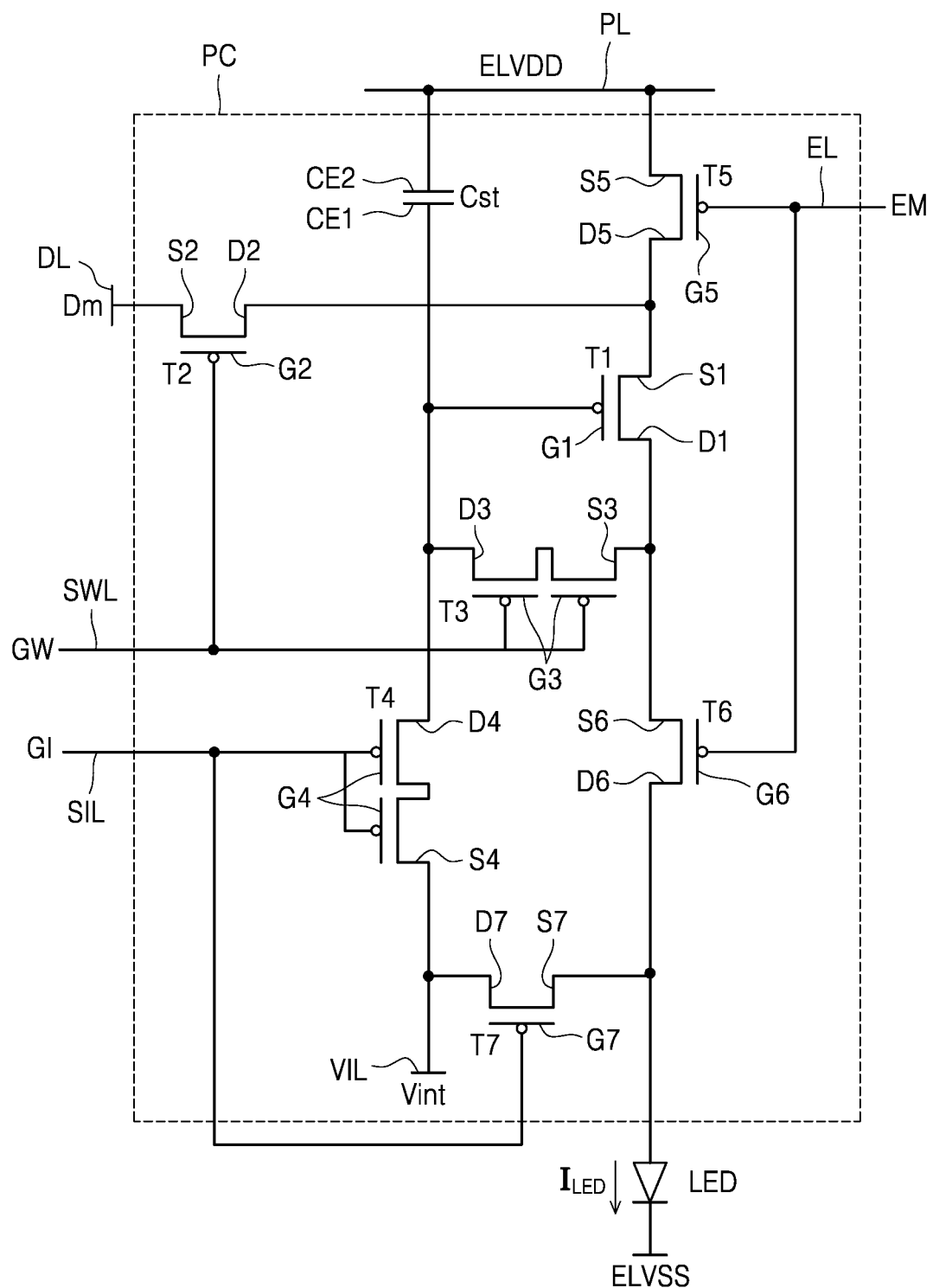
FIG. 4 is a circuit diagram showing a light-emitting diode corresponding to one pixel in a display panel, and a pixel circuit electrically connected to the light-emitting diode, according to an embodiment.

FIG. 4 is a circuit diagram showing the light-emitting diode LED corresponding to one pixel in a display panel, and a pixel circuit PC electrically connected to the light-emitting diode LED, according to an embodiment.

Referring to FIG. 4, the pixel circuit PC is electrically connected to the light-emitting diode LED. The pixel circuit PC may include a plurality of transistors, and a storage capacitor. The transistors and the storage capacitor may be electrically connected to various conductive lines. The conductive lines may include signal lines SWL, SIL, EL, and DL, an initialization voltage line VIL, and a driving voltage line PL.

FIG. 4 shows that each pixel circuit PC is connected to the signal lines SWL, SIL, EL, and DL, the initialization voltage line VIL, and the driving voltage line PL, but the present disclosure is not limited thereto. In another embodiment, at least one of the signal lines SWL, SIL, EL, and DL, the initialization voltage line VIL, or the driving voltage line PL may be shared by neighboring (e.g., by adjacent) pixel circuits PC.

In an embodiment, FIG. 4 shows that the pixel circuit PC includes a driving transistor T1, a switching transistor T2, a compensation transistor T3, a first initialization transistor T4, an operation control transistor T5, an emission control transistor T6, and a second initialization transistor T7.

The signal lines include a first scan line SWL for transferring a scan signal GW, a second scan line SIL for transferring a previous scan signal GI to the first initialization transistor T4 and the second initialization transistor T7, an emission control line EL for transferring an emission control signal EM to the operation control transistor T5 and the emission control transistor T6, and a data line DL crossing the first scan line SWL and for transferring a data signal Dm. The driving voltage line PL transfers a driving voltage ELVDD to the driving transistor T1, and the initialization voltage line VIL transfers an initialization voltage Vint for initializing the driving transistors T1 and the pixel electrode of the light-emitting diode LED.

The storage capacitor Cst includes a first electrode CE1, and a second electrode CE2, and may be connected to a gate electrode of the driving transistor T1. The second electrode CE2 is connected to the driving voltage line PL, and the opposite electrode of the light-emitting diode LED is connected to a common voltage ELVSS. Accordingly, the light-emitting diode LED emits light by receiving a driving current $I_{LED}$ from the driving transistor T1.

In FIG. 4, the compensation transistor T3 and the first initialization transistor T4 are each shown as having a dual-gate electrode, but the present disclosure is not limited thereto, and in some embodiments, at least one of the compensation transistor T3 or the first initialization transistor T4 may have a single-gate (e.g., one gate) electrode.

FIG. 4 illustrates that the pixel circuit PC includes seven transistors and one storage capacitor, but the present disclosure is not limited thereto. The number of transistors and the number of storage capacitors may be variously modified depending on a design of the pixel circuit PC, for example, such that the number of transistors thereof may be 6 or less or 8 or more.

FIG. 4 shows a case in which the first initialization transistor T4 and the second initialization transistor T7 are connected to the same second scan line SIL, but the present disclosure is not limited thereto. In another embodiment, the first initialization transistor T4 may be connected to the second scan line SIL to operate according to the previous scan signal GI, and the second initialization transistor T7 may be connected to a first scan line SWL or a second scan line SIL of a pixel circuit PC that is in a previous row or a next row relative to the pixel circuit PC corresponding to the second initialization transistor T7.

Figure 5A:
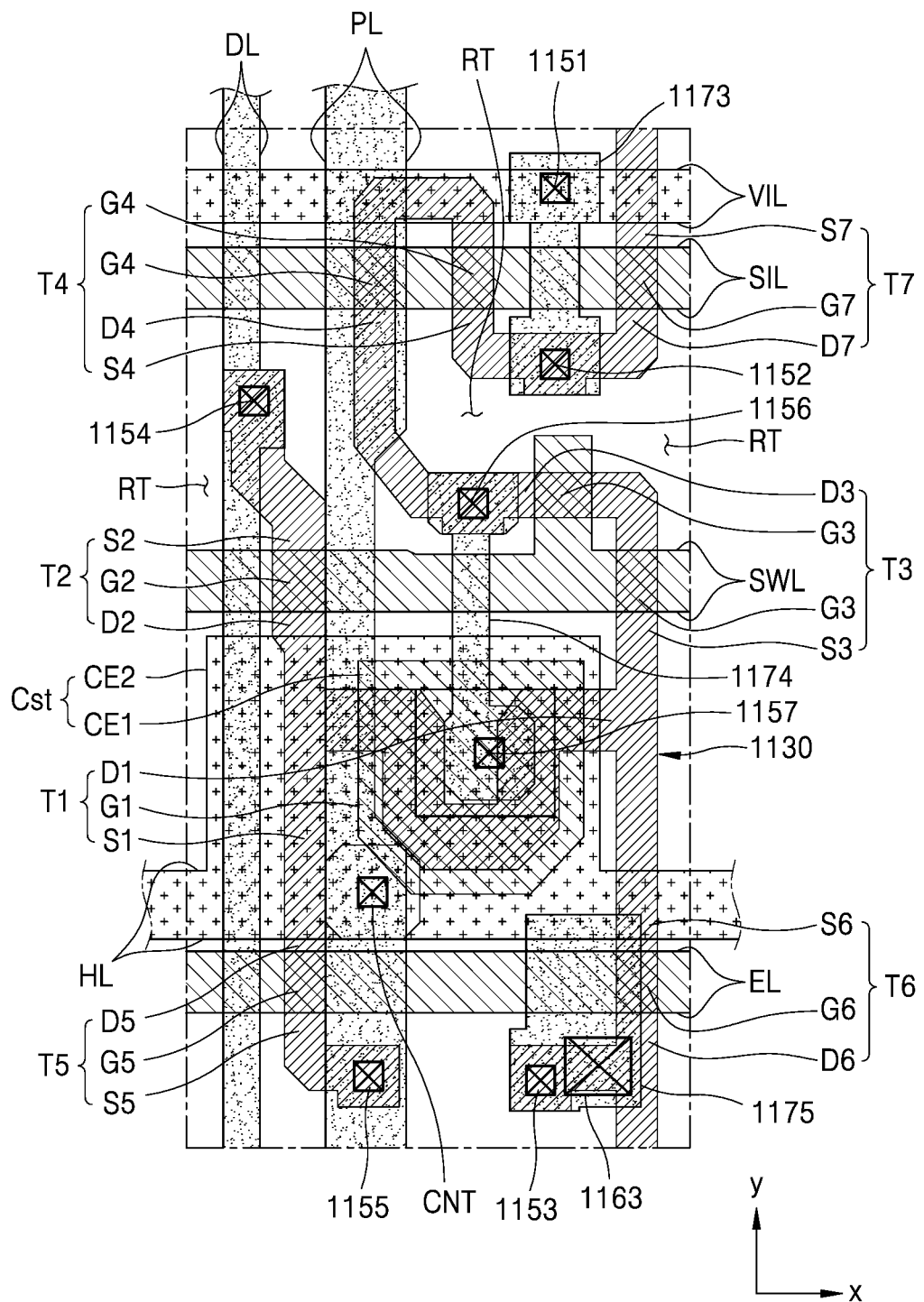
FIG. 5A is a plan view of one pixel circuit in a display panel according to an embodiment.

FIG. 5A is a plan view of one pixel circuit in a display panel according to an embodiment.

Referring to FIG. 5A, the driving transistor T1, the switching transistor T2, the compensation transistor T3, the first initialization transistor T4, the operation control transistor T5, the emission control transistor T6, and the second initialization transistor T7 are arranged along a semiconductor layer 1130.

Some regions of the semiconductor layer 1130 correspond to semiconductor layers of the driving transistor T1, the switching transistor T2, the compensation transistor T3, the first initialization transistor T4, the operation control transistor T5, the emission control transistor T6, and the second initialization transistor T7. In other words, the semiconductor layers of the driving transistor T1, the switching transistor T2, the compensation transistor T3, the first initialization transistor T4, the operation control transistor T5, the emission control transistor T6, and the second initialization transistor T7 are connected to one another, and curved (or bent) into various suitable shapes.

FIG. 5A shows that the driving transistor T1, the switching transistor T2, the compensation transistor T3, the first initialization transistor T4, the operation control transistor T5, the emission control transistor T6, and the second initialization transistor T7 are formed along the semiconductor layer 1130, but the present disclosure is not limited thereto. In another embodiment, some transistors thereof may be formed along the semiconductor layer 1130, and other transistors thereof may be formed along another semiconductor layer that is spatially and electrically separated (e.g., spaced apart) from the semiconductor layer 1130. For example, the compensation transistor T3 and/or the first initialization transistor T4 may be formed along a semiconductor layer that includes a different material from that of the semiconductor layer 1130 shown in FIG. 5A. In some embodiments, when the semiconductor layer 1130 includes a silicon-based semiconductor material, the semiconductor layer at (e.g., in or on) which the compensation transistor T3 and/or the first initialization transistor T4 are formed may include an oxide-based semiconductor material.

The semiconductor layer 1130 includes a channel region, and a source region and a drain region at opposite sides of the channel region. The source region and the drain region may be appreciated as a source electrode and a drain electrode, respectively, of a corresponding transistor. Hereinafter, the source region and the drain region may be referred to as a source electrode and a drain electrode, respectively, for convenience of description.

The driving transistor T1 includes a driving gate electrode G1 overlapping with a driving channel region, and a driving source electrode S1 and a driving drain electrode D1 at opposite sides of the driving channel region. The driving channel region overlapping with the driving gate electrode G1 has a bent shape (e.g., an omega shape) to establish a longer channel length within a narrow space. When the driving channel region has a longer channel length, a driving range of a gate voltage increases, and thus, a gray level of the light emitted from the organic light-emitting diode OLED may be finely controlled. Accordingly, the quality of an image display may be improved.

The switching transistor T2 includes the switching gate electrode G2 overlapping with a switching channel region, and the switching source electrode S2 and the switching drain electrode D2 at opposite sides of the switching channel region. The switching drain electrode D2 may be connected to the driving source electrode S1.

The compensation transistor T3 may be a dual-transistor including compensation gate electrodes S3 overlapping with two compensation channel regions, respectively, and a compensation source electrode S3 and the compensation drain electrode D3 at opposite sides of the two compensation channel regions. The compensation transistor T3 may be connected to the driving gate electrode G1 of the driving transistor T1 via a node connecting line 1174 that will be described in more detail below.

The first initialization transistor T4 may be a dual-transistor including first initialization gate electrodes G4 overlapping with two first initialization channel regions, respectively, and the first initialization source electrode S4 and the first initialization drain electrode D4 at opposite sides of the two first initialization channel regions.

The operation control transistor T5 may include the operation control gate electrode G5 overlapping with an operation control channel region, and the operation control source electrode S5 and the operation control drain electrode D5 at opposite sides of the operation control channel region. The operation control drain electrode D5 may be connected to the driving source electrode S1.

The emission control transistor T6 may include the emission control gate electrode G6 overlapping with an emission control channel region, and the emission control source electrode S6 and the emission control drain electrode D6 at opposite sides of the emission control channel region. The emission control source electrode S6 may be connected to the driving drain electrode D1.

The second initialization transistor T7 may include the second initialization gate electrode G7 overlapping with a second initialization channel region, and the second initialization source electrode S7 and the second initialization drain electrode D7 at opposite sides of the second initialization channel region.

The first scan line SWL, the second scan line SIL, the emission control line EL, and the driving gate electrode G1 may be arranged on the semiconductor layer 1130 with one or more insulating layer(s) provided therebetween.

The first scan line SWL, the second scan line SIL, and the emission control line EL may each extend in a first direction (e.g., the x-direction). Some portions of the first scan line SWL may correspond to the switching gate electrode G2 and the compensation gate electrode G3. Some portions of the second scan line SIL may correspond to the first initialization gate electrode G4 and the second initialization gate electrode G7. Some portions of the emission control line EL may correspond to the operation control gate electrode G5 and the emission control gate electrode G6.

The driving gate electrode G1 is an isolated electrode, and may be connected to the compensation transistor T3 via the node connecting line 1174. An electrode voltage line HL may be arranged on the first scan line SWL, the second scan line SIL, the emission control line EL, and the driving gate electrode G1 with one or more insulating layer(s) provided therebetween.

The electrode voltage line HL may extend in the first direction to cross with the data line DL and the driving voltage line PL. A part of the electrode voltage line HL covers at least a part of the driving gate electrode G1, and may configure the storage capacitor Cst with the driving gate electrode G1. For example, the driving gate electrode G1 may correspond to (e.g., may be) the first electrode CE1 of the storage capacitor Cst, and a part of the electrode voltage line HL may correspond to (e.g., may be) the second electrode CE2 of the storage capacitor Cst.

The second electrode CE2 of the storage capacitor Cst is electrically connected to the driving voltage line PL, which will be described in more detail below. The electrode voltage line HL may be connected to the driving voltage line PL that is on the electrode voltage line HL via a contact hole CNT. Therefore, the electrode voltage line HL may have the same voltage level (e.g., a constant or substantially constant voltage) as that of the driving voltage line PL. The electrode voltage line HL may be considered as (e.g., a part of or connected to) the driving voltage line PL that extends in a transverse direction.

The data line DL, the driving voltage line PL, an initialization connecting line 1173, and the node connecting line 1174 may be arranged on the electrode voltage line HL with one or more insulating layer(s) provided therebetween.

The data line DL and the driving voltage line PL may extend in a second direction (e.g., the y-direction). The data line DL may be connected to the switching source electrode S2 of the switching transistor T2 via a contact hole 1154. A part of the data line DL may be the switching source electrode.

An end of the initialization connecting line 1173 is connected to the first and second initialization transistors T4 and T7 via a contact hole 1152, and another end of the initialization connecting line 1173 may be connected to the initialization voltage line VIL that will be described in more detail below via a contact hole 1151.

An end of the node connecting line 1174 may be connected to the compensation drain electrode D3 via a contact hole 1156, and another end of the node connecting line 1174 may be connected to the driving gate electrode G1 via a contact hole 1157.

The initialization voltage line VIL may be arranged on the data line DL, the driving voltage line PL, the initialization connecting line 1173, and the node connecting line 1174 with one or more insulating layer(s) provided therebetween.

The initialization voltage line VIL extends in the first direction (e.g., the x-direction). The initialization voltage line VIL may be connected to the first and second initialization transistors T4 and T7 via the initialization connecting line 1173. The initialization voltage line VIL is at the same layer as that of the electrode voltage line HL, and may include the same material as that of the electrode voltage line HL.

Figure 5B:
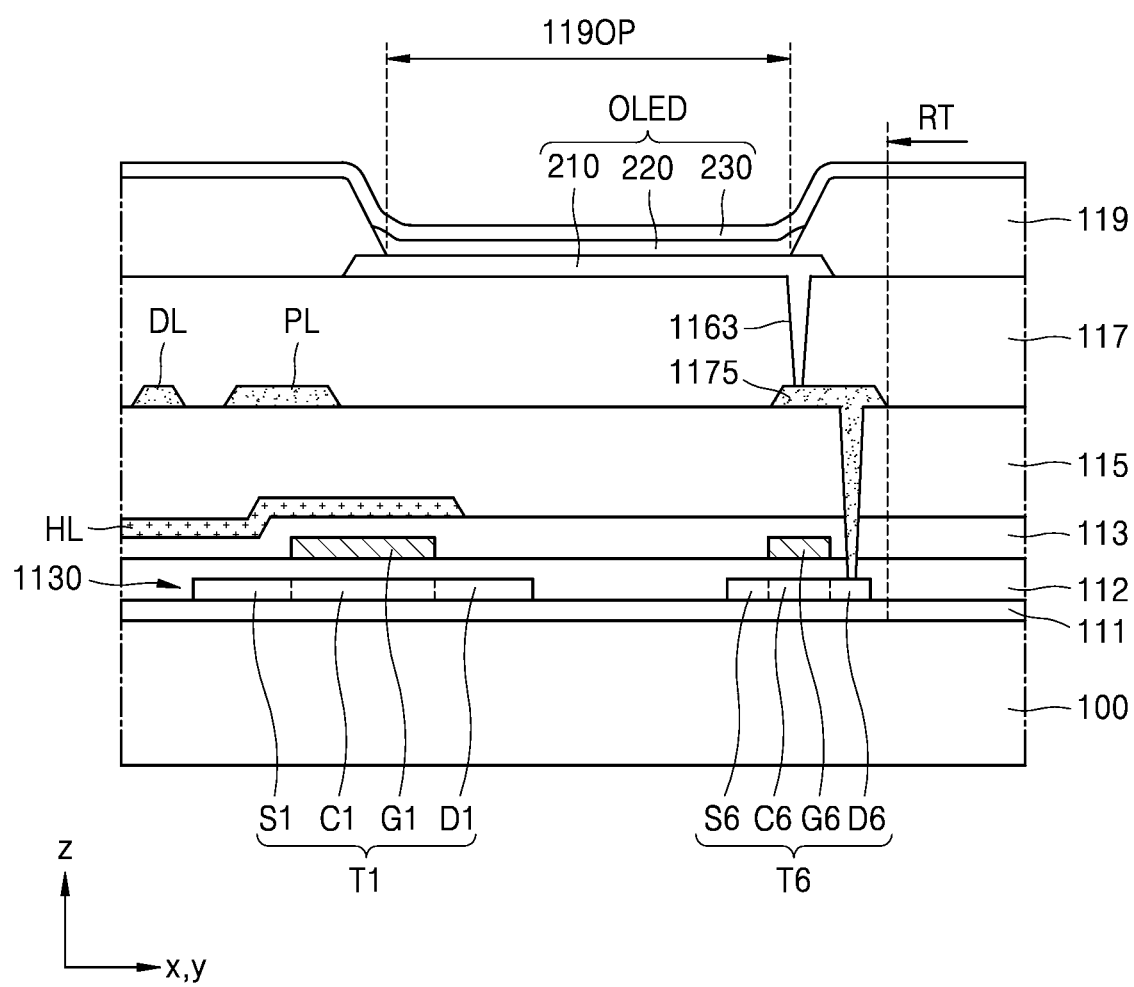
FIG. 5B is a cross-sectional view of the pixel circuit of FIG. 5A, and a light-emitting diode connected to the pixel circuit.

FIG. 5B is a cross-sectional view of the pixel circuit PC of FIG. 5A, and the light-emitting diode LED connected to the pixel circuit PC. FIG. 5B shows that the light-emitting diode LED includes an organic light-emitting diode OLED according to an embodiment.

Referring to FIG. 5B, the pixel circuit PC is on the substrate 100, and the organic light-emitting diode OLED may be on the pixel circuit PC.

The substrate 100 may include a glass material or a polymer resin as described above. The buffer layer 111 is on the substrate 100 to reduce or block infiltration of impurities, moisture, and/or external air from a lower portion of the substrate 100, and to provide a flat or substantially flat surface on the substrate 100. The buffer layer 111 may include an inorganic material, for example, such as an oxide material or a nitride material, an organic material, or an inorganic-organic composite material, and may have a single-layer structure or a multi-layered structure including one or more of the inorganic material and the organic material.

The semiconductor layer 1130 may be on the buffer layer 111. As described above with reference to FIG. 5A, the semiconductor layer 1130 may include the source region (or the source electrode), the drain region (or the drain electrode), and the channel region between the source region and the drain region of each transistor. In an embodiment, FIG. 5B shows the driving channel region C1, and the driving source electrode S1 and the driving drain electrode D1 at opposite sides of the driving channel region C1 of the driving transistor T1, and the emission control channel region C6, and the emission control source electrode S6 and the emission control drain electrode D6 at opposite sides of the emission control channel region C6 of the emission control transistor T6. The semiconductor layer 1130 may include polysilicon, amorphous silicon, an oxide semiconductor, or an organic semiconductor.

The first insulating layer 112 may be on the semiconductor layer 1130. The first insulating layer 112 is a gate insulating layer, and may electrically insulate the gate electrode thereon (e.g., the driving gate electrode G1 and the emission control gate electrode G6) from the semiconductor layer 1130 thereunder. The first insulating layer 112 may include silicon oxide, silicon nitride, silicon oxynitride, and/or the like.

The first electrode CE1 of the storage capacitor Cst may be provided as a single body with the driving gate electrode G1 of the driving transistor T1. For example, the driving gate electrode G1 of the driving transistor T1 may act as the first electrode CE1 of the storage capacitor Cst.

The second electrode CE2 may overlap with the first electrode CE1 with the second insulating layer 113 therebetween. In an embodiment, a part of the electrode voltage line HL may be the second electrode CE2 of the storage capacitor Cst. The second electrode CE2 may be covered by the third insulating layer 115. The second insulating layer 113 and the third insulating layer 115 may each include silicon oxide, silicon nitride, silicon oxynitride, and/or the like.

The data line DL, the driving voltage line PL, and the contact metal 1175 may be on the third insulating layer 115, and the contact metal 1175 may be electrically connected to a pixel electrode 210 via a contact hole 1163 in the fourth insulating layer 117 that is between the contact metal 1175 and the pixel electrode 210.

The fourth insulating layer 117 may include an inorganic insulating material, for example, such as silicon oxide or silicon nitride, and/or an organic insulating material. The organic insulating material may include a general universal polymer (e.g., such as benzocyclobutene (BCB), polyimide, hexamethyldisiloxane (HMDSO), polymethylmethacrylate (PMMA), or polystyrene (PS)), polymer derivatives having phenol groups, an acryl-based polymer, an imide-based polymer, an aryl ether-based polymer, an amide-based polymer, a fluoride-based polymer, a p-xylene-based polymer, a vinyl alcohol-based polymer, and/or blends thereof.

The pixel electrode 210 may be a reflective electrode. In some embodiments, the pixel electrode 210 may have a multi-layered structure including a reflective layer including Ag, Mg, Al, Pt, Pd, Au, Ni, Nd, Ir, Cr, and/or a compound thereof, and a transparent or semi-transparent electrode layer on the reflective layer. The transparent or semi-transparent electrode layer may include at least one electrode material selected from the group consisting of indium tin oxide (ITO), indium zinc oxide (IZO), zinc oxide (ZnO), indium oxide ($In_2O_3$), indium gallium oxide, and aluminum zinc oxide (AZO). In some embodiments, the pixel electrode 210 may include a stacked structure including ITO/Ag/ITO.

A pixel defining layer 119 has an opening 1190P exposing a central portion of the pixel electrode 210 to define an emission area of the organic light-emitting diode OLED. For example, a size and a width of the opening 1190P may correspond to a size and a width of the emission area (e.g., a pixel).

The pixel defining layer 119 increases a distance between an edge of the pixel electrode 210 and the opposite electrode 230 on the pixel electrode 210, to prevent or substantially prevent the generation of an arc at the edge of the pixel electrode 210. The pixel defining layer 119 may include a transparent material (e.g., a transparent organic insulating material). The pixel defining layer 119 may include polyimide (e.g., a photosensitive polyimide) (PI). As another example, the pixel defining layer 119 may include an organic insulating material, for example, such as polyamide, an acrylic resin, benzocyclobutene, hexamethyldisiloxane (HMDSO), a phenol resin, and/or the like.

The emission layer 220 may include an organic material including a fluorescent or a phosphor material for emitting red, green, or blue light. In some embodiments, a functional layer may be further located under and/or on (e.g., above) the emission layer 220. The functional layer may include a hole transport layer, a hole injection layer, an electron injection layer, and/or an electron transport layer.

The opposite electrode 230 may be a transmissive electrode. The opposite electrode 230 may be provided as a metal thin film having a small work function including Li, Ca, LiF/Ca, LiF/Al, Al, Ag, Mg, and/or a compound thereof. Also, a transparent conductive oxide (TCO) layer, for example, such as ITO, IZO, ZnO, or $In_2O_3$, may be further provided over the metal thin film. The opposite electrode 230 may be formed to entirely cover the display area DA.

Referring to FIG. 5A and FIG. 5B, semiconductor layer(s) of the transistors, electrodes of the transistors, electrodes of the storage capacitor, and conductive lines may be located between the substrate 100 and the pixel defining layer 119. At least two selected from among the semiconductor layer(s), electrodes, conductive lines, and the pixel electrode 210 may overlap with each other, and an overlapping region thereof is a region through which light may not pass. On the other hand, as shown in FIGS. 5A and 5B, when the substrate 100 is viewed from a direction that is perpendicular to or substantially perpendicular to the substrate 100 (e.g., in a plan view), a region at (e.g., in or on) which the semiconductor layer(s), the electrodes, the conductive lines, and the pixel electrode 210 do not overlap with each other may correspond to a region (hereinafter, referred to as a gap region RT) through which light passes.

The gap region RT may include a stacked structure including (e.g., including only) the pixel defining layer 119, the substrate 100, and the insulating layers between the pixel defining layer 119 and the substrate 100. The stacked structure (e.g., a stacked part thereof) is located between a top surface of the substrate 100 and a top surface of the pixel defining layer 119, and includes (e.g., includes only) the insulation layers (e.g., the buffer layer 111, the first insulating layer 112, the second insulating layer 113, the third insulating layer 115, the fourth insulating layer 117, and the pixel defining layer 119). For example, at (e.g., in or on) the gap region RT, the buffer layer 111, the first to fourth insulating layers 112, 113, 115, and 117, and the pixel defining layer 119 may be stacked (e.g., may only be stacked). In other words, the gap region RT (or the stack structure) does not include the layers including a material for reflecting or blocking light (e.g., such as the semiconductor layers, the electrodes, the conductive lines, and the pixel electrode 210) between the top surface of the substrate 100 and the top surface of the pixel defining layer 119.

Figure 6:
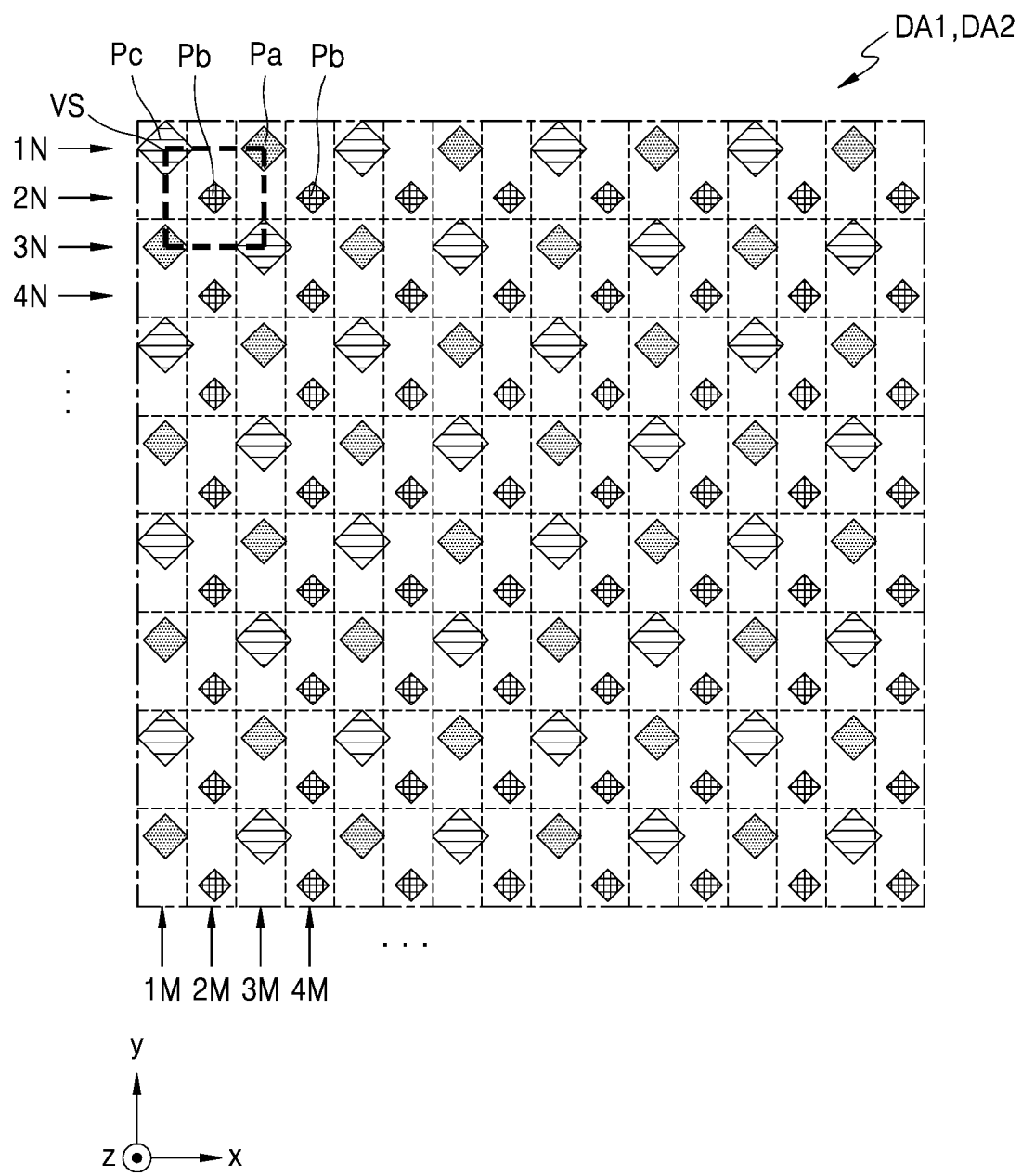
FIG. 6 is a plan view of pixels arranged in a first display area and a second display area of a display panel according to an embodiment.

FIG. 6 is a plan view of the pixels arranged at (e.g., in or on) the first display area DA1 and the second display area DA2 of the display panel according to an embodiment.

Referring to FIG. 6, first to third pixels Pa, Pb, and Pc may be located at (e.g., in or on) the first and second display areas DA1 and DA2. The first to third pixels Pa, Pb, and Pc may emit light of different colors from each other through the light-emitting diodes, and a size of each of the first to third pixels Pa, Pb, and Pc may correspond to the opening 110OP of the pixel defining layer 119 described above with reference to FIG. 5B. Hereinafter, for convenience of description, it will be described that the first pixel Pa corresponds to a red pixel, the second pixel Pb corresponds to a green pixel, and the third pixel Pc corresponds to a blue pixel, but the present disclosure is not limited thereto.

The arrangement, aperture ratios (e.g., a ratio of a light-emitting region per unit area), and/or the number of the first to third pixels Pa, Pb, and Pc of the first display area DA1 may be equal to or substantially equal to those of the first to third pixels Pa, Pb, and Pc of the second display area DA2. For example, the arrangement and/or the number of pixels at (e.g., in or on) the first display area DA1 may be the same or substantially the same as the arrangement and/or the number of pixels at (e.g., in or on) the second display area DA2 for the same sized unit area. Each of the pixels, for example, each of the first to third pixels Pa, Pb, and Pc, includes a light-emitting diode, and thus, the same or substantially the same arrangement and/or the number of pixels may denote that the arrangement and/or the number of light-emitting diodes at the first display area DA1 may be the same or substantially the same as those of the second display area DA2. For example, for the same sized unit area, the arrangement and/or the number of light-emitting diodes at (e.g., in or on) the first display area DA1 may be equal to or substantially equal to those of the light-emitting diodes at (e.g., in or on) the second display area DA2.

The first to third pixels Pa, Pb, and Pc may be arranged in an RGBG matrix type arrangement (e.g., such as PENTILE® arrangement, PENTILE® being a duly registered trademark of Samsung Display Co, Ltd.). In a first row 1N, a plurality of third pixels Pc and a plurality of first pixels Pa are alternately arranged, and in an adjacent second row 2N, a plurality of second pixels Pb are arranged to be spaced apart from one another by at a suitable distance (e.g., a predetermined or certain distance). In a third row 3N, the first pixels Pa and the third pixels Pc are alternately arranged, and in a fourth row 4N, the plurality of second pixels Pb are arranged to be spaced apart from one another by at a suitable distance (e.g., a predetermined or certain distance). The above arrangements of the pixels are repeated to an N-th row, N being a natural integer. Here, the size (e.g., the width) of the third pixel Pc and the first pixel Pa may be greater than the size (e.g., the width) of the second pixel Pb.

The plurality of first pixels Pa and third pixels PC in the first row 1N and the plurality of second pixels Pb in the second row 2N are alternately arranged row by row. Therefore, the third pixels Pc and the first pixels Pa are alternately arranged in a first column 1M, the plurality of second pixels Pb are arranged in an adjacent second column 2M to be spaced apart from one another by a suitable distance (e.g., a predetermined or certain distance), the first pixels Pa and the third pixels Pc are alternately arranged in a third column 3M, and the plurality of second pixels Pb are arranged in a fourth column 4M to be spaced apart from one another by a suitable distance (e.g., a predetermined or certain distance). In addition, the above arrangement of the pixels is repeated to an M-th column, M being a natural integer.

In other words, from among vertexes of a virtual quadrilateral VS having a center at the second pixel Pb as the center thereof, the third pixels Pc are arranged at first and third vertexes that are opposite to each other, and the first pixels Pa may be arranged at remaining vertexes, that is, second and fourth vertexes. Here, the virtual quadrilateral VS may be variously modified, for example, as a rectangle, a rhombus, a square, and/or the like.

This pixel arrangement structure may be referred to as an RGBG matrix structure or an RGBG structure (e.g., a PENTILE® matrix structure or a PENTILE® structure, PENTILE® being a duly registered trademark of Samsung Display Co, Ltd.). By applying rendering, in which a color of a pixel is represented by sharing the colors of its adjacent pixels, a high resolution may be obtained via a smaller number of pixels.

FIG. 6 shows that first to third pixels Pa, Pb, Pc are arranged at (e.g., in or on) the first display area DA1 in the RGBG matrix structure, but the present disclosure is not limited thereto. For example, the first to third pixels Pa, Pb, and Pc may be arranged in various suitable structures, for example, such as a stripe structure, a mosaic arrangement structure, a delta arrangement structure, and/or the like.

As shown in FIG. 6, the first display area DA1 and the second display area DA2 may have the same or substantially the same arrangement of the first to third pixels Pa, Pb, Pc. A density of the pixels in the first display area DA1 and a density of the pixels in the second display area DA2 may be the same or substantially the same as each other. In other words, the number (or area) of the pixels at (e.g., in or on) the first display area DA1 and the number (or area) of the pixels at (e.g., in or on) the second display area DA2 per unit area may be equal to or substantially equal to each other.

Figure 7:
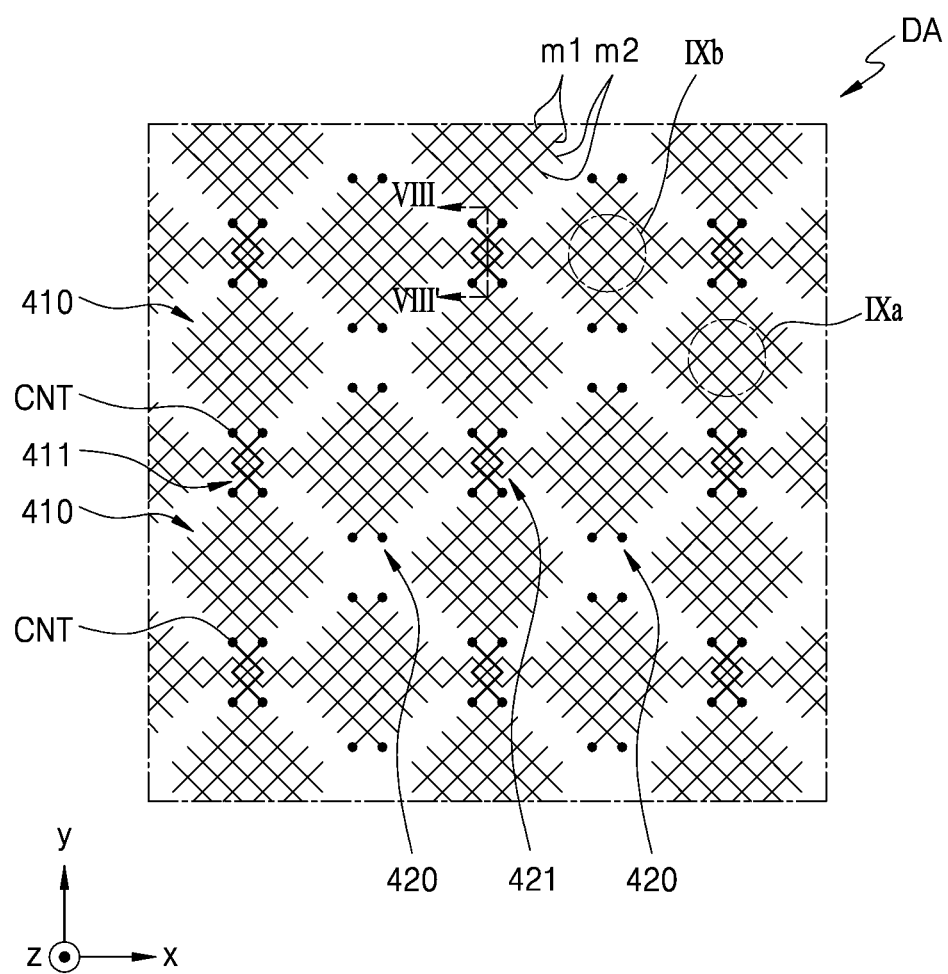
FIG. 7 is a plan view of touch electrodes in an input sensing layer of a display panel according to an embodiment.
Figure 8:
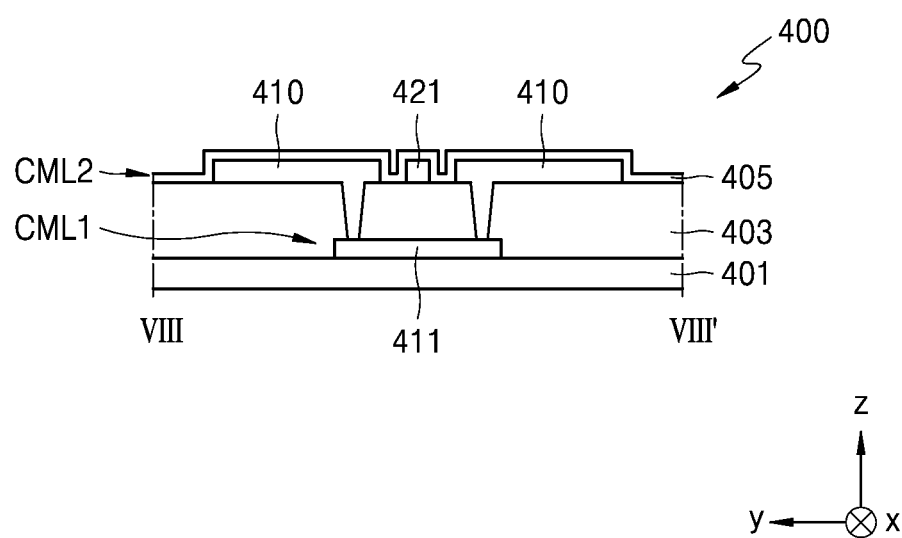
FIG. 8 is a cross-sectional view of the input sensing layer taken along the line VIII-VIII' of FIG. 7.
Figure 9A:
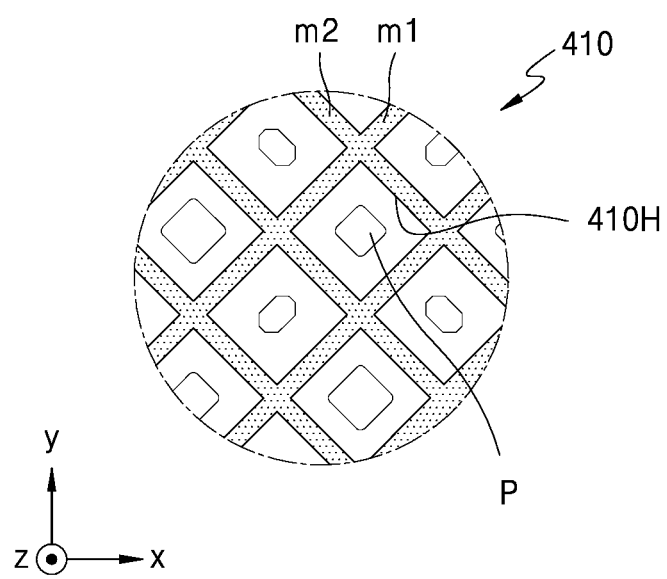
FIG. 9A is a plan view showing an enlarged view of the portion IXa in FIG. 7.
Figure 9B:
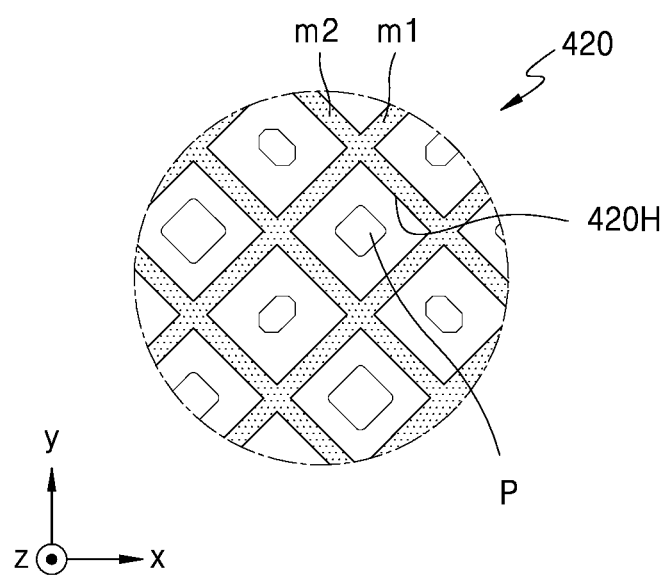
FIG. 9B is a plan view showing an enlarged view of the portion IXb in FIG. 7.

FIG. 7 is a plan view showing touch electrodes in the input sensing layer 400 in a display panel according to an embodiment, FIG. 8 is a cross-sectional view of the input sensing layer 400 taken along the line VIII-VIII' of FIG. 7, FIG. 9A is a plan view showing an enlarged view of the portion IXa in FIG. 7, and FIG. 9B is a plan view showing an enlarged view of the portion IXb in FIG. 7.

Referring to FIG. 7, the input sensing layer 400 may include first touch electrodes 410 and second touch electrodes 420. The first touch electrodes 410 and the second touch electrodes 420 may be arranged to cross each other at (e.g., in or on) the display area DA.

The first touch electrodes 410 may be arranged along the y-direction, and the second touch electrodes 420 may be arranged along the x-direction crossing (e.g., intersecting with) the y-direction. The first touch electrodes 410 that are arranged along the y-direction may be connected to one another via first connecting electrodes 411 from among neighboring (e.g., adjacent ones of the) first touch electrodes 410. The second touch electrodes 420 arranged along the x-direction may be connected to one another via second connecting electrodes 421 from among neighboring (e.g., adjacent ones of the) second touch electrodes 420.

The first and second touch electrodes 410 and 420 may each have a mesh structure as shown in FIG. 7. For example, each of the first and second touch electrodes 410 and 420 may include first metal lines m1 and second metal lines m2 that extend to cross each other. The first metal lines m1 and the second metal lines m2 may be connected integrally with each other to form a mesh (e.g., a net) structure. The first metal lines m1 and the second metal lines m2 may each include molybdenum (Mo), mendelevium (Mb), argentum (Ag), titanium (Ti), copper (Cu), aluminum (Al), and/or an alloy thereof.

Because each of the first and second touch electrodes 410 and 420 has a mesh structure, each of the first and second touch electrodes 410 and 420 may include holes 410H or 420H. The holes 410H and 420H may overlap with the pixels P as shown in FIGS. 9A and 9B.

Similar to the first and second touch electrodes 410 and 420, the first and second connecting electrodes 411 and 412 may each have metal lines having a mesh structure. The metal lines of the first and second connecting electrodes 411 and 412 also include the holes like those shown in FIGS. 9A and 9B, and the holes thereof may overlap with the pixels.

As shown in FIG. 8, the input sensing layer 400 may include a first touch insulating layer 401, a first conductive layer CML1, a second touch insulating layer 403, a second conductive layer CML2, and a third touch insulating layer 405. The first conductive layer CML1 may include the first connecting electrodes 411. The second conductive layer CML2 may include the first and second touch electrodes 410 and 420, and the second connecting electrodes 421. In another embodiment, one of the first and second touch electrodes 410 and 420 may be included in the first conductive layer CML1, and the other thereof may be included in the second conductive layer CML2. The first to third touch insulating layers 401, 403, and 405 may each include an inorganic insulating material and/or an organic insulating material. In an embodiment, the first to third touch insulating layers 401, 403, and 405 may each include silicon oxide, silicon nitride, and/or silicon oxynitride.

Figure 10A:
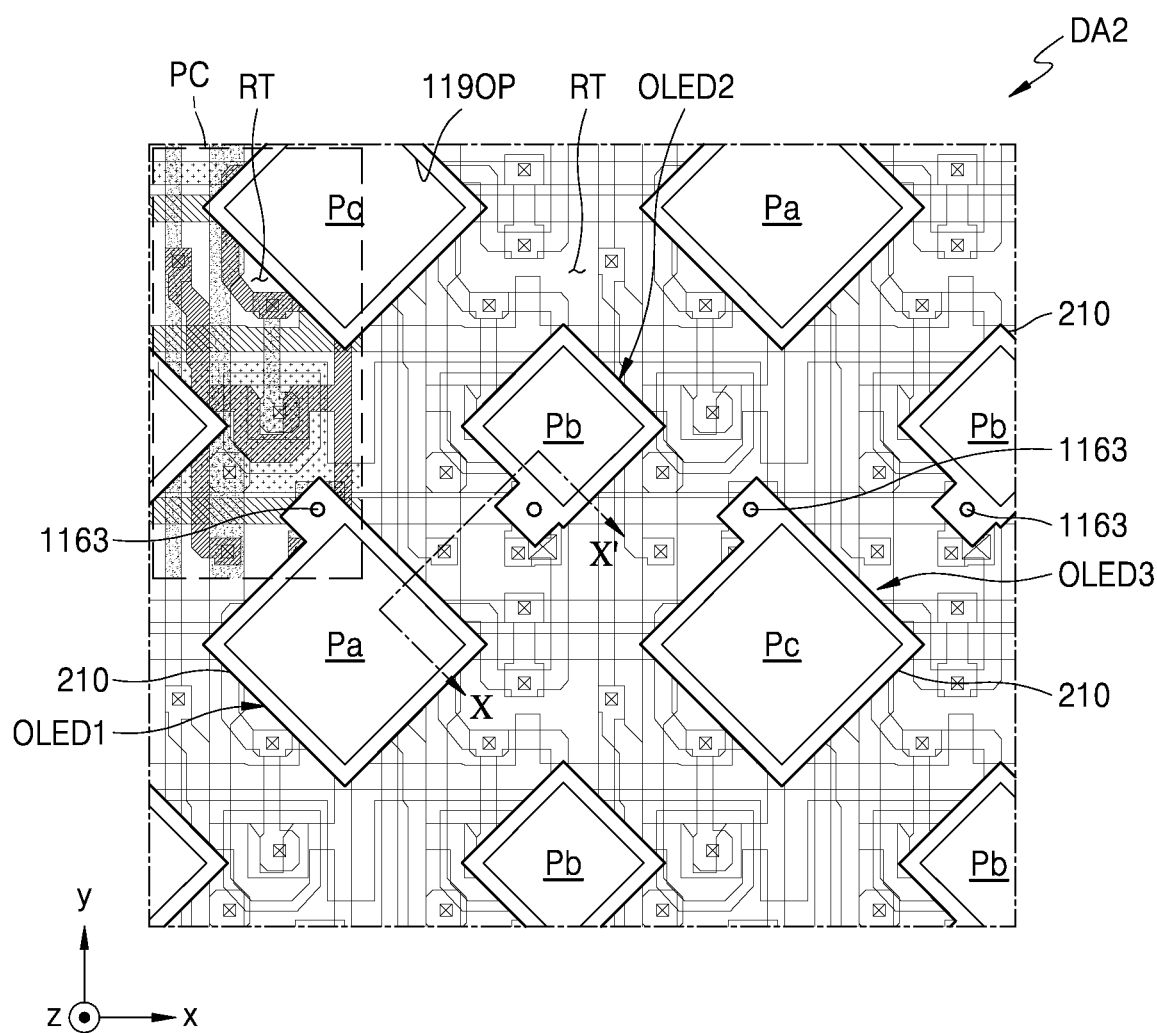
FIG. 10A is a plan view partially showing a second display area according to a process of manufacturing a display panel according to an embodiment.
Figure 10B:
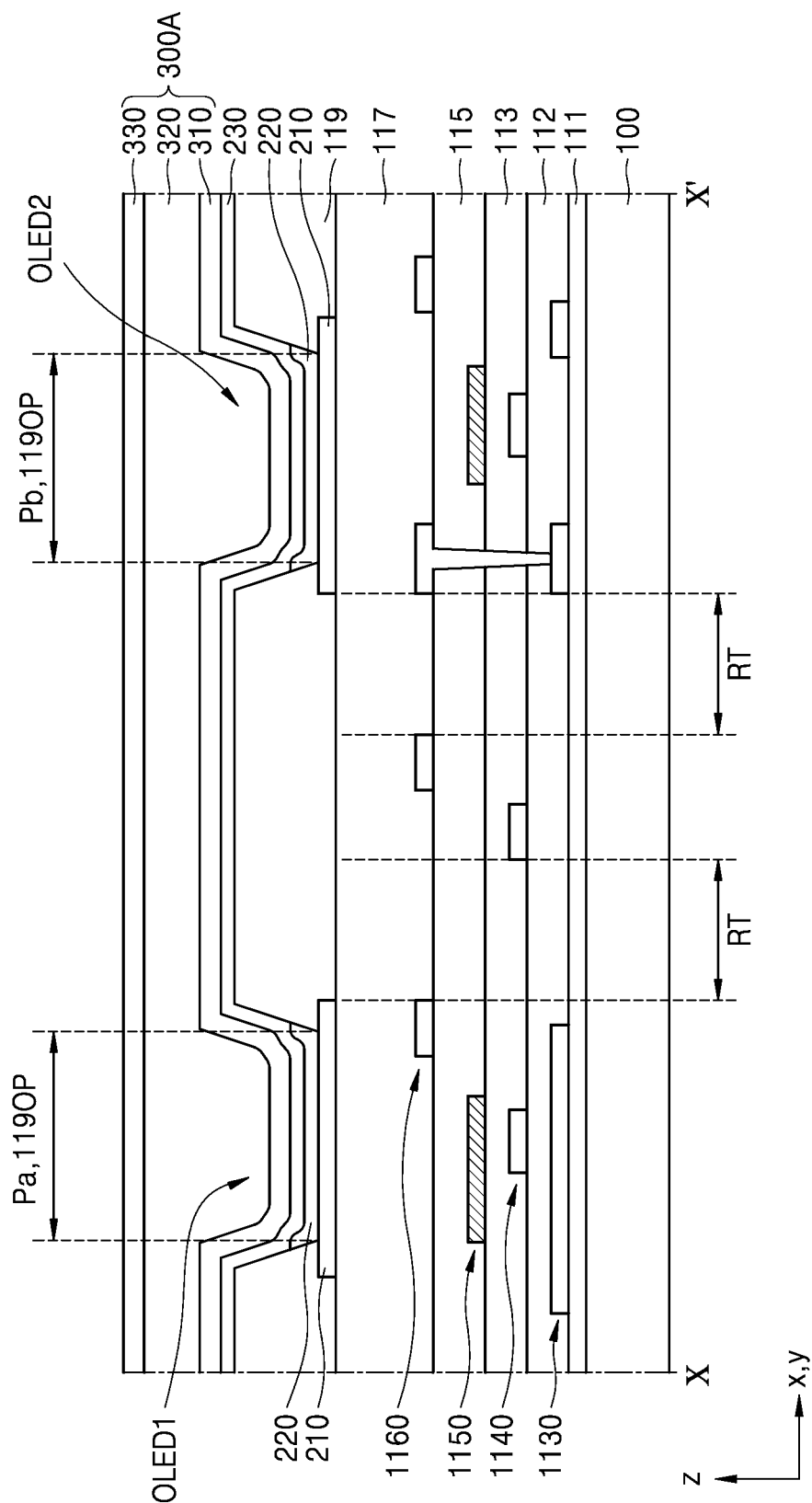
FIG. 10B is a cross-sectional view of the display panel taken along the line X-X' of FIG. 10A.

FIG. 10A is a plan view of the display panel 10 according to manufacturing processes, and shows a part of the second display area DA2, and FIG. 10B is a cross-sectional view of the display panel 10 taken along the line X-X' of FIG. 10A.

Referring to FIGS. 10A and 10B, the pixel circuits PC are formed on the substrate 100. The pixel circuits PC may be arranged into rows and columns, and each of the pixel circuits PC may have the structure described above with reference to FIGS. 5A and 5B.

For example, as shown in FIG. 10B, the buffer layer 111 is provided on the substrate 100, and the semiconductor layer 1130 may be provided on the buffer layer 111. The first insulating layer 112 is provided on the semiconductor layer 1130, a gate layer 1140 is provided on the first insulating layer 112, the second insulating layer 113 is provided on the gate layer 1140, and an electrode layer 1150 may be provided on the second insulating layer 113. The third insulating layer 115 is provided on the electrode layer 1150, a source/drain layer 1160 is provided on the third insulating layer 115, and the fourth insulating layer 117 may be provided on the source/drain layer 1160.

The semiconductor layer 1130 includes the semiconductor layers of the transistors described above with reference to FIGS. 5A and 5B. The gate layer 1140 includes the gate electrodes of the transistors, the scan lines, the emission control lines, and the first electrode of the storage capacitor. The electrode layer 1150 includes the second electrode of the storage capacitor. The source/drain layer 1160 may include the lines (e.g., the data lines and the driving voltage line shown in FIGS. 5A and 5B) connected to the source region or the drain region of the semiconductor layer 1130, and/or a connector (e.g., the contact metal of FIG. 5B).

After forming the pixel circuits PC, light-emitting diodes may be formed. In this regard, FIG. 10A shows first to third organic light-emitting diodes OLED1, OLED2, and OLED3. Each of the first to third organic light-emitting diodes OLED1, OLED2, and OLED3 may have a stacked structure in which the pixel electrode 210, the emission layer 220, and the opposite electrode 230 are stacked on one another. The emission layers 220 in the first to third organic light-emitting diodes OLED1, OLED2, and OLED3 may emit different colored lights from one another.

The pixel electrode 210 is on the fourth insulating layer 117 as shown in FIG. 10B, and may be electrically connected to one of the pixel circuits PC via a contact hole 1163 as shown in FIG. 10A. The pixel electrodes 210 are spaced apart from one another, and edges of each pixel electrode 210 are covered by the pixel defining layer 119. The pixel defining layer 119 may include an opening 1190P corresponding to each of the pixel electrodes 210, and the opening 1190P corresponds to an emission area or a pixel. The opening 1190P overlapping with the pixel electrode 210 in the first organic light-emitting diode OLED1 may define the first pixel Pa, and the opening 1190P overlapping with the pixel electrode 210 of the second organic light-emitting diode OLED2 may define the second pixel Pb. Similarly, the opening 1190P overlapping with the pixel electrode 210 of the third organic light-emitting diode OLED3 may define the third pixel Pc.

Unlike the pixel electrode 210 and the emission layer 220, which are spaced apart from other pixel electrodes 210 and emission layers 220, the opposite electrode 230 may be integrally provided (e.g., unitarily formed) to correspond to the first to third pixels Pa, Pb, and PC as shown in FIG. 10B. The opposite electrode 230 may be shared by the first to third organic light-emitting diodes OLED1, OLED2, and OLED3.

A plurality of gap regions RT are at (e.g., in or on) the substrate 100. The gap region RT is a region where the elements having light transmittance from among the layers between the substrate 100 and the opposite electrode 230, for example, such as the semiconductor layer 1130, the gate layer 1140, the electrode layer 1150, the source/drain layer 1160, and the pixel electrode 210, do not overlap with one another. In an embodiment, the gap region RT may be a region at (e.g., in or on) which the buffer layer 111, the first to fourth insulating layers 112, 113, 115, and 117, and the pixel defining layer 119 overlap with one another as shown in FIG. 10B.

After forming the opposite electrode 230, an encapsulation layer 300A may be provided. The encapsulation layer 300A may include at least one inorganic encapsulation layer and at least one organic encapsulation layer, and in an embodiment, FIG. 10B shows a first inorganic encapsulation layer 310, an organic encapsulation layer 320, and a second inorganic encapsulation layer 330.

The first and second inorganic encapsulation layers 310 and 330 may include one or more inorganic materials from among aluminum oxide, titanium oxide, tantalum oxide, hafnium oxide, zinc oxide, silicon oxide, silicon nitride, and silicon oxynitride. The first inorganic encapsulation layer 310 and the second inorganic encapsulation layer 330 may each have a single-layer structure or a multi-layered structure including one or more of the above-described materials. The organic encapsulation layer 320 may include a polymer-based material. The polymer-based material may include an acryl-based resin, for example, such as polymethacrylate and/or polyacrylic acid, an epoxy-based resin, polyimide, polyethylene, and/or the like. In an embodiment, the organic encapsulation layer 320 may include an acrylate polymer.

Figure 11A:
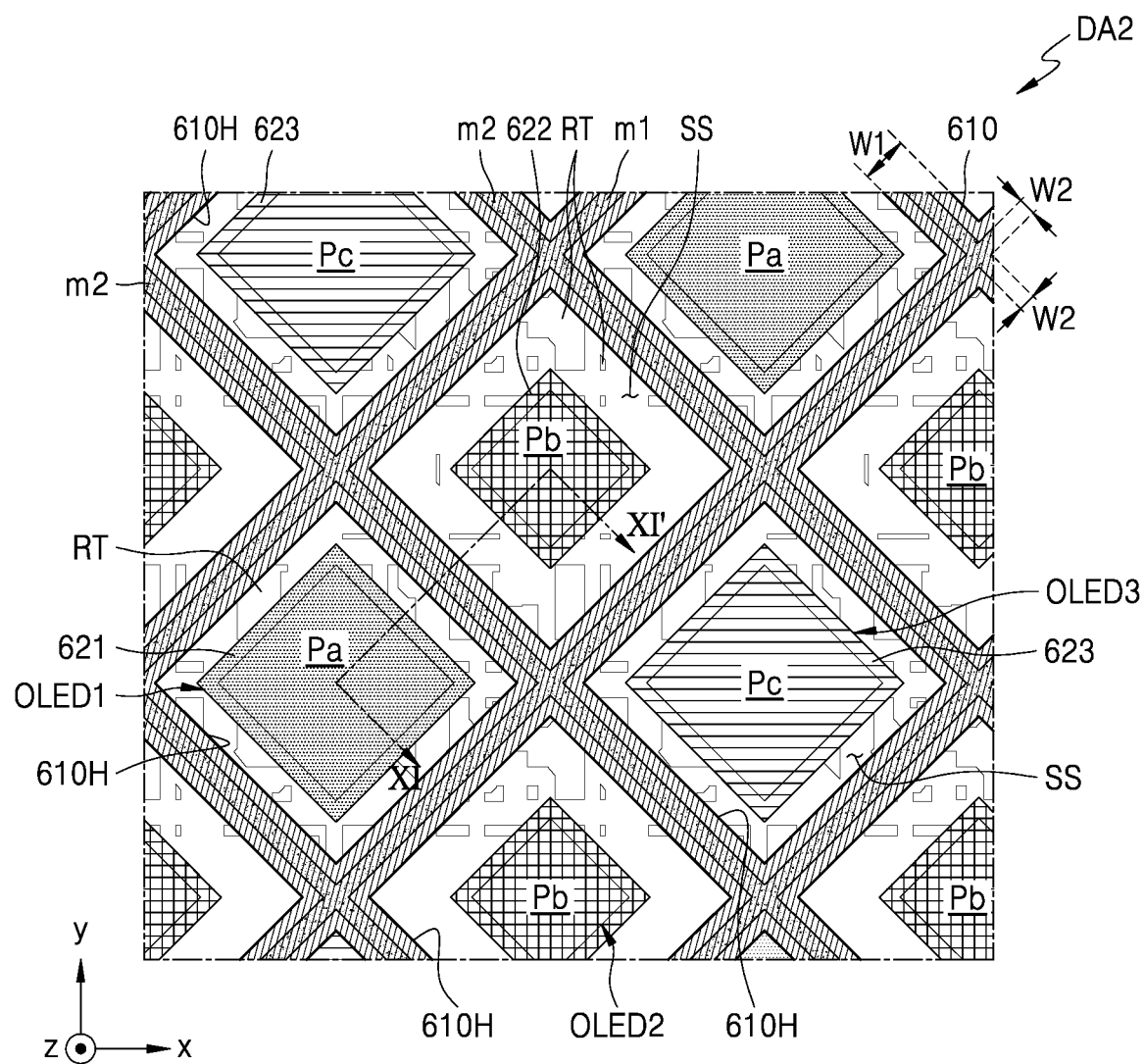
FIG. 11A is a plan view partially showing a second display area according to a process of manufacturing the display panel according to an embodiment.
Figure 11B:
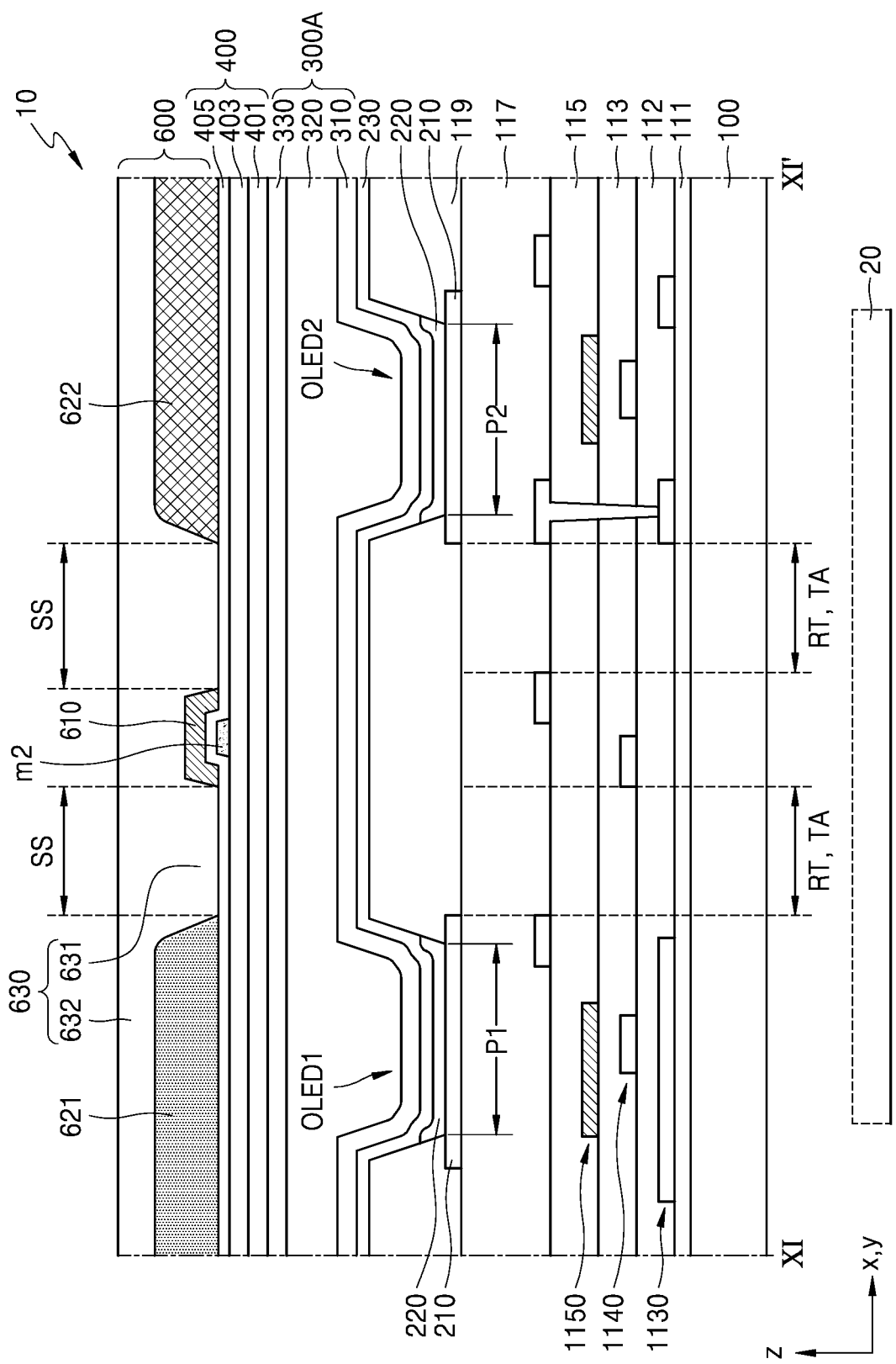
FIG. 11B is a cross-sectional view of the display panel taken along the line XI-XI' of FIG. 11A.

FIG. 11A is a plan view of the display panel 10 according to a manufacturing process according to an embodiment, and shows a part of the second display area DA2. FIG. 11B is a cross-sectional view of the display panel 10 taken along the line XI-XI' of FIG. 11A. FIGS. 11A and 11B show a manufacturing process after the processes illustrated with reference to FIGS. 10A and 10B have been performed.

Referring to FIGS. 11A and 11B, the input sensing layer 400 is provided on the encapsulation layer 300A. The input sensing layer 400 may have the structure described above with reference to FIGS. 7 to 9B, and FIG. 11B shows that the touch electrode having a mesh structure (e.g., the first and second metal lines m1 and m2 that cross each other) is included in the input sensing layer 400. Each of the first to third pixels Pa, Pb, and Pc may be entirely surrounded (e.g., around a periphery thereof) by the first and second metal lines m1 and m2 that cross each other, and in this regard, FIG. 11B shows that the second metal line m2 is between adjacent ones of the light-emitting diodes, for example, such as between the first and second organic light-emitting diodes OLED1 and OLED2.

The input sensing layer 400 may include the first to third touch insulating layers 401, 403, and 405 as shown in FIG. 11B, and the first and second metal lines m1 and m2 may be between the second and third touch insulating layers 403 and 405. In another embodiment, the first and second metal lines m1 and m2 may be between the first touch insulating layer 401 and the second touch insulating layer 403.

After forming the input sensing layer 400, an anti-reflection layer 600 including a light-blocking portion (e.g., a light-blocking pattern) 610, and first to third color filters 621, 622, and 623 is formed.

The light-blocking portion 610 may overlap with the metal lines, for example, such as the first and second metal lines m1 and m2. For example, the first and second metal lines m1 and m2 may be covered by the light-blocking portion 610. A width W2 of each of the first and second metal lines m1 and m2 may be less than or equal to or substantially equal to a width W1 of the light-blocking portion 610.

The light-blocking portion 610 may have the same or substantially the same shape as that of the first and second metal lines m1 and m2, for example, such as a mesh structure. In a plan view, the light-blocking portion 610 may surround (e.g., around a periphery of) each of the first to third pixels Pa, Pb, and Pc. In other words, the first pixel Pa may be located in an internal hole 610H that is defined by the light-blocking portion 610 surrounding (e.g., around a periphery of) the first pixel Pa in a plan view. Similarly, each of the second and third pixels Pb and Pc may be located in an internal hole 610H defined by the light-blocking portion 610 in a plan view. Therefore, the light-blocking portion 610 may be between neighboring (e.g., adjacent) pixels (or adjacent light-emitting diodes). In this regard, FIG. 11B shows that the light-blocking portion 610 is between the first and second pixels Pa and Pb, and/or between the first and second organic light-emitting diodes OLED1 and OLED2. For example, when the light-blocking portion 610 is between the first and second pixels Pa and Pb, this may denote that the light-blocking portion 610 is between the opening 1190P of the pixel defining layer 119 defining the first pixel Pa and the opening 1190P of the pixel defining layer defining the second pixel Pb in a plan view.

The first to third color filters 621, 622, and 623 may be spaced apart from one another. The first to third color filters 621, 622, and 623 may be located in the internal holes 610H defined by the light-blocking portion 610, while overlapping with the first to third pixels Pa, Pb, and Pc. The first to third color filters 621, 622, and 623 may be arranged according to the colors of the light emitted from the first to third pixels Pa, Pb, and Pc. For example, the first color filter 621 may be a red color filter overlapping with the first pixel Pa, the second color filter 622 may be a green color filter overlapping with the second pixel Pb, and the third color filter 623 may be a blue color filter overlapping with the third pixel Pc. In this regard, FIG. 11B shows that the first color filter 621 overlaps with the pixel electrode 210 and the emission layer 220 in the first organic light-emitting diode OLED1 that corresponds to the first pixel Pa, and the second color filter 622 overlaps with the pixel electrode 210 and the emission layer 220 in the second organic light-emitting diode OLED2 that corresponds to the second pixel Pb.

The first to third color filters 621, 622, and 623 may be separately formed. For example, a photosensitive material including a green pigment or dye is entirely applied on the substrate 100, and then exposure and development processes may be performed to obtain the second color filter 622 overlapping with the second pixel Pb. Similarly, a photosensitive material including a red pigment or dye is entirely applied on the substrate 100, and then exposure and development processes may be performed to obtain the first color filter 621 overlapping with the first pixel Pa. Likewise, a photosensitive material including a blue pigment or dye is entirely applied onto the substrate 100, and then exposure and development processes may be performed to obtain the third color filter 623 overlapping with the third pixel Pc.

The first to third color filters 621, 622, and 623 may be spaced apart from the light-blocking portion 610. A separation space SS between the light-blocking portion 610 and each of the first to third color filters 621, 622, and 623 may have a frame shape in a plan view as shown in FIG. 11A. Therefore, in a plan view, each of the first to third pixels Pa, Pb, and Pc may be entirely surrounded (e.g., around a periphery thereof) by the separation space SS. In this regard, FIG. 11B shows that two adjacent color filters, for example, the first and second color filters 621 and 622, are spaced apart from the light-blocking portion 610 by the separation space SS. For example, the first color filter 621 and the light-blocking portion 610 are spaced apart (e.g., are separated) from each other, such that the separation space SS may be between the first color filter 621 and the light-blocking portion 610, and the second color filter 622 and the light-blocking portion 610 are spaced apart (e.g., are separated) from each other, such that the separation space SS may be between the second color filter 622 and the light-blocking portion 610. Likewise, the third color filter 623 and the light-blocking portion 610 are spaced apart (e.g., are separated) from each other, such that the separation space SS may be between the third color filter 623 and the light-blocking portion 610.

In the separation space SS, a portion 631 (hereinafter, referred to as a first portion) of the overcoat layer 630 on the first to third color filters 621, 622, and 623 may be formed as shown in FIG. 11B. The first portion 631 of the overcoat layer 630 overlaps with the pixel defining layer 119. The first portion 631 of the overcoat layer 630 may be in direct contact with a layer under (e.g., underneath) the anti-reflection layer 600, for example, such as the third touch insulating layer 405 corresponding to the upper surface of the input sensing layer 400.

The overcoat layer 630 may include the first portion 631 and a second portion 632 integrally provided with the first portion 631. The second portion 632 may overlap with upper surfaces of the first to third color filters 621, 622, and 623. In the overcoat layer 630, a thickness corresponding to the second portion 632 may be less than a thickness corresponding to the first portion 631.

The overcoat layer 630 includes a transparent material. For example, the overcoat layer 630 may include an organic insulating material, such as a silicon-based resin, an acryl-based resin, an epoxy-based resin, polyethylene, and/or the like. As used in the present specification, when something is described as being transparent, this denotes that it has light transmittance, but also does not have a color corresponding to a visible ray wavelength band. For example, the first to third color filters 621, 622, and 623 have light transmittance, but has suitable (e.g., predetermined or certain) colors (e.g., red, green, and blue), and thus, the first to third color filters 621, 622, and 623 may transmit light of a suitable (e.g., a predetermined or certain) wavelength band. Therefore, the first to third color filters 621, 622, and 623 are not considered to be transparent as that term is used in the present specification. On the other hand, the overcoat layer 630 has light transmittance but also does not have a color corresponding to the visible ray wavelength band, and thus, is transparent as that term is used in the present specification. Therefore, the overcoat layer 630 may transmit light of various suitable wavelength bands, not just the light of a certain wavelength band.

The separation space SS and/or the first portion 631 of the overcoat layer 630 may overlap with the gap region RT. For example, the stacked region including the buffer layer 111, the first to fourth insulating layers 112, 113, 115, and 117, and the pixel defining layer 119 may overlap with the first portion 631 of the overcoat layer 630.

As shown in FIG. 11B, when the component 20 is located at (e.g., in or on) the second display area DA2, the light emitted from the component 20 or proceeding toward the component 20 moves along a direction that is perpendicular to or substantially perpendicular to the substrate 100, and the light may pass through a region where the separation space SS and the gap region RT overlap with each other. The overlapping regions between the separation space SS and the gap region RT may correspond to a transmission area TA through which the light used by the component 20 may pass.

Figure 12:
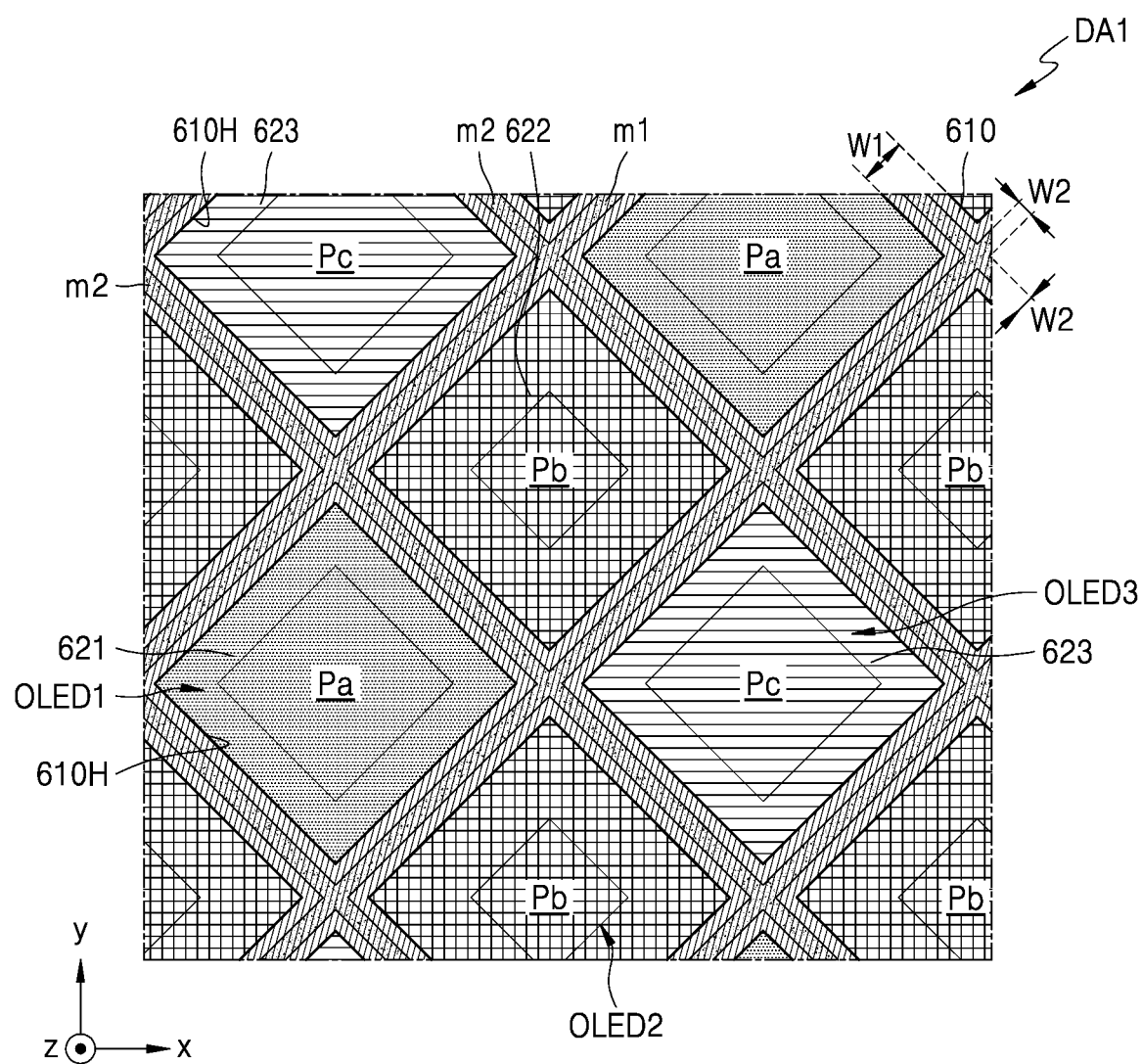
FIG. 12 is a plan view of a first display area in the display panel according to an embodiment.

FIG. 12 is a plan view of the first display area DA1 in the display panel according to an embodiment.

Referring to FIG. 12, a plurality of pixels, for example, the first to third pixels Pa, Pb, and Pc, are at (e.g., in or on) the first display area DA1 of the display panel, and detailed manufacturing processes of the first to third pixels Pa, Pb, and Pc at (e.g., in or on) the second display area DA2 are described above with reference to FIGS. 10A to 11B. However, as shown in FIG. 12, the first display area DA1 may be different from the second display area DA2, in that the separation space SS (e.g., see FIG. 11B) may not be provided at (e.g., in or on) the first display area DA1.

Referring to FIG. 12, the touch electrode may include the first and second metal lines m1 and m2 crossing each other, and may be covered by the light-blocking portion 610. The first to third color filters 621, 622, and 623 are on the first to third pixels Pa, Pb, and Pc, respectively, and the first to third pixels Pa, Pb, and Pc are surrounded (e.g., around a periphery thereof) by the light-blocking portion 610. The light-blocking portion 610 may not be spaced apart (e.g., may not be separated) from each of the first to third color filters 621, 622, and 623. For example, edges of the first color filter 621 may overlap with the light-blocking portion 610, edges of the second color filter 622 may overlap with the light-blocking portion 610, and edges of the third color filter 623 may overlap with the light-blocking portion 610.

Figure 13:
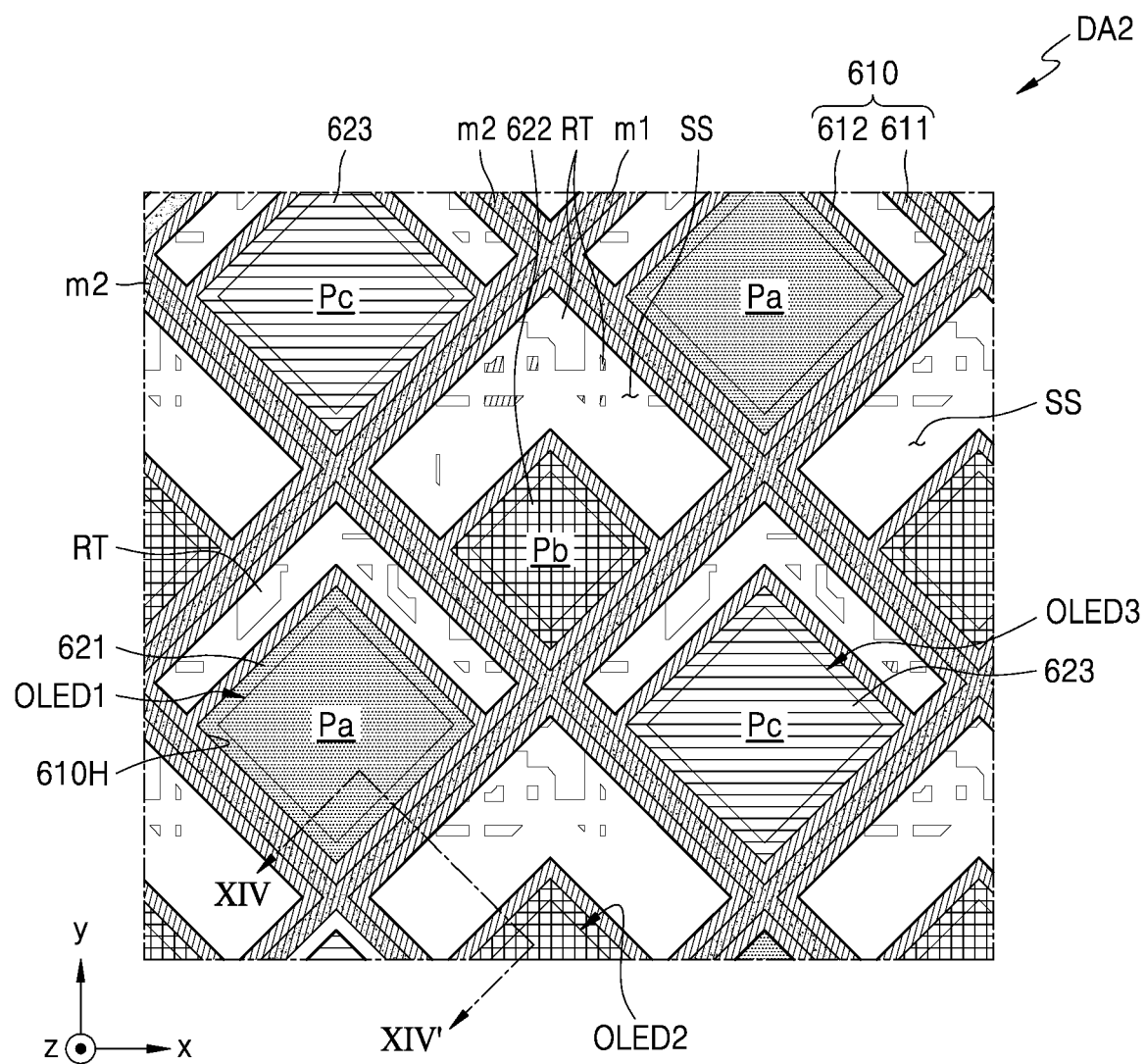
FIG. 13 is a plan view of a second display area in the display panel according to an embodiment.
Figure 14:
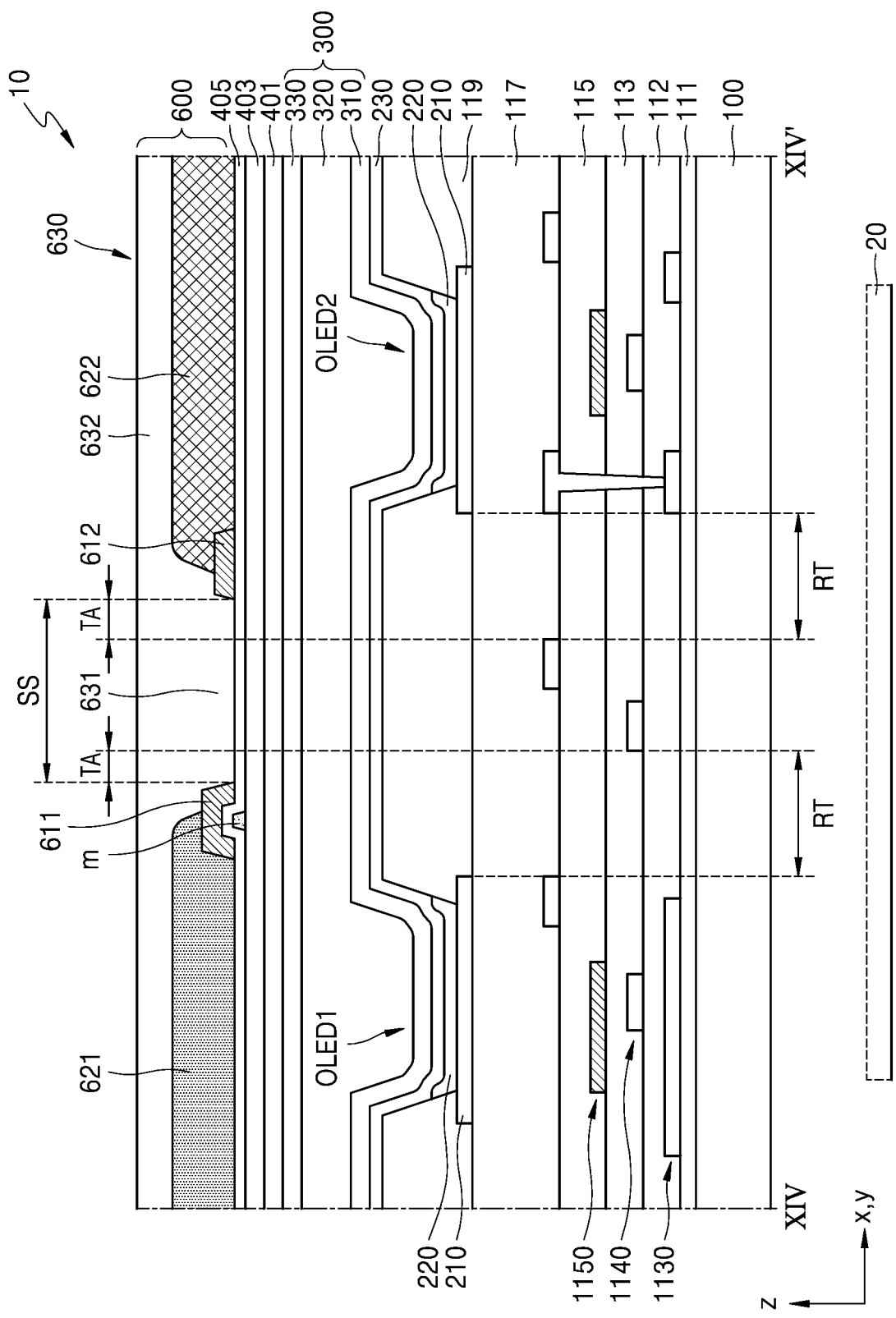
FIG. 14 is a cross-sectional view of the display panel taken along the line XIV-XIV' of FIG. 13.

FIG. 13 is a plan view of the second display area DA2 in the display panel according to an embodiment, and FIG. 14 is a cross-sectional view of the display panel 10 taken along the line XIV-XIV' of FIG. 13.

The separation space SS may at least partially surround (e.g., around a periphery of) each of the first to third color filters 621, 622, and 623. For example, in an embodiment, FIGS. 11A and 11B described above show that the separation space SS is formed as a frame that entirely surrounds (e.g., around a periphery of) each of the first to third color filters 621, 622, and 623.

In another embodiment, FIG. 13 shows that the separation space SS may partially surround (e.g., around a periphery of) each of the first to third color filters 621, 622, and 623. For example, the separation space SS may have an L-shape in a plan view. Each of the first to third color filters 621, 622, and 623 may be adjacent to two sides of the light-blocking portion 610 that has a quadrilateral shape on a plane (e.g., in a plan view), and thus, the separation space SS may have an L-shape. In another embodiment, each of the first to third color filters 621, 622, and 623 may be adjacent to one side of the light-blocking portion 610 that has a quadrilateral shape on a plane (e.g., in a plan view), and in this case, the separation space SS may have a U-shape.

The light-blocking portion 610 may include a branch 612 extending from a main body 611 that overlaps with the first and second metal lines m1 and m2. As described above with reference to FIGS. 11A and 11B, the touch electrode shown in FIG. 13 may also include the first and second metal lines m1 and m2 forming a mesh structure, and the first and second metal lines m1 and m2 may be covered by the main body 611 of the light-blocking portion 610. Therefore, the main body 611 of the light-blocking portion 610 may also have the mesh structure, as described above.

The branch 612 may be integrally connected to the main body 611, but may extend along the edges of the first to third pixels Pa, Pb, and Pc without overlapping with the first and second metal lines m1 and m2. The main body 611 and the branch 612 may each configure a closed loop shape surrounding (e.g., around a periphery of) each of the first to third pixels Pa, Pb, and Pc, and thus, the light-blocking portion 610 may include the internal hole 610H overlapping with the first to third pixels Pa, Pb, and Pc.

In this regard, FIG. 14 shows that the main body 611 and the branch 612 of the light-blocking portion 610 overlap with the pixel defining layer 119, and the separation space SS is formed between the branch 612 and the main body 611. Because the first portion 631 of the overcoat layer 630 is in the separation space SS, the first portion 631 of the overcoat layer 630 may also overlap with the pixel defining layer 119. The second portion 632 integrally connected to the first portion 631 of the overcoat layer 630 may overlap with the first to third color filters 621, 622, and 623, and the material included in the overcoat layer 630 has been described above.

The separation space SS and/or the first portion 631 of the overcoat layer 630 may overlap with the gap region RT. For example, the stacked region including the buffer layer 111, the first to fourth insulating layers 112, 113, 115, and 117, and the pixel defining layer 119 may overlap with the first portion 631 of the overcoat layer 630. As described above, the component 20 may be located at (e.g., in or on) the second display area DA2. In this case, the light emitted from or proceeding toward the component 20 moves along the direction that is perpendicular to or substantially perpendicular to the substrate 100, and the light may pass through the overlapping region between the separation space SS and the gap region RT. The overlapping regions between the separation space SS and the gap region RT may correspond to a transmission area TA through which the light used by the component 20 may pass.

Figure 15:
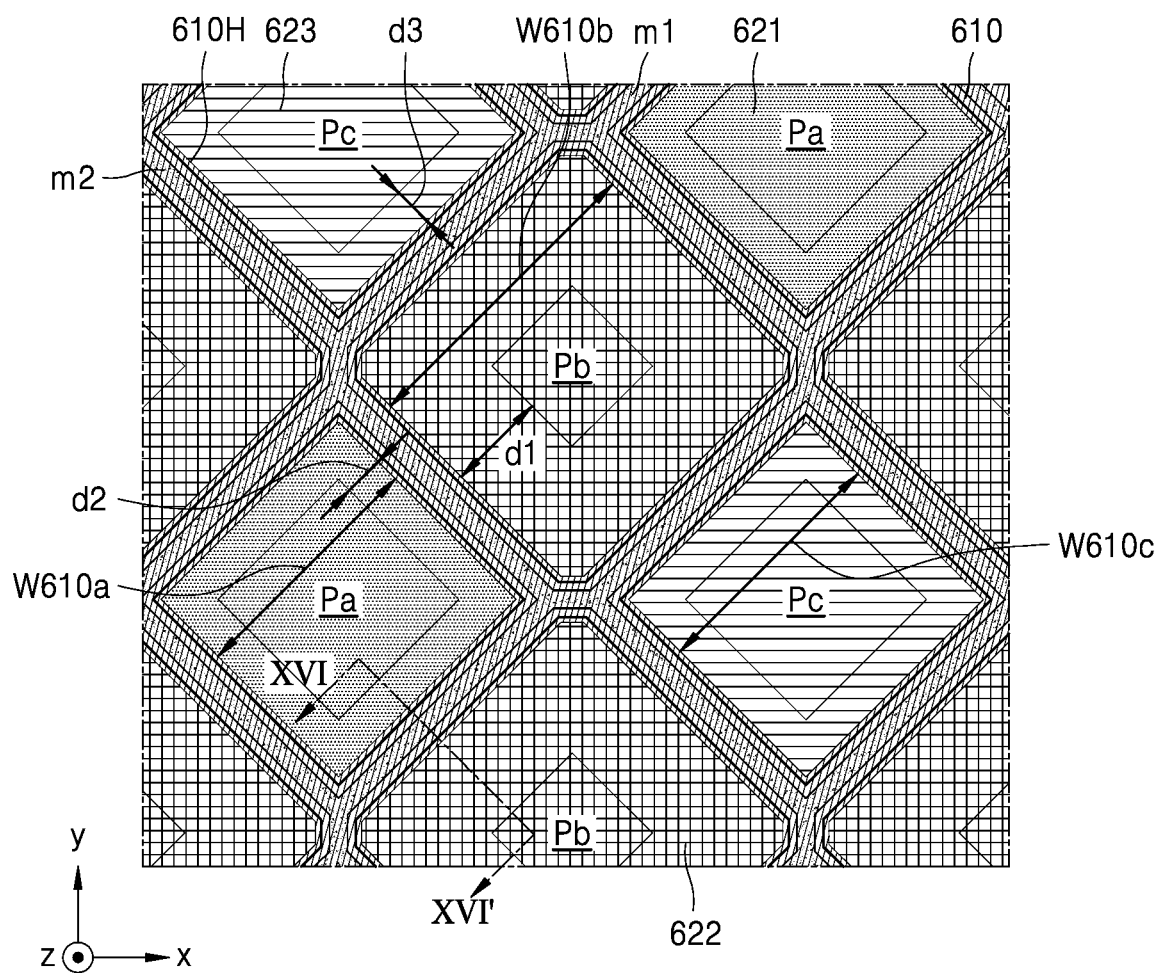
FIG. 15 is a plan view of a second display area in the display panel according to an embodiment.
Figure 16:
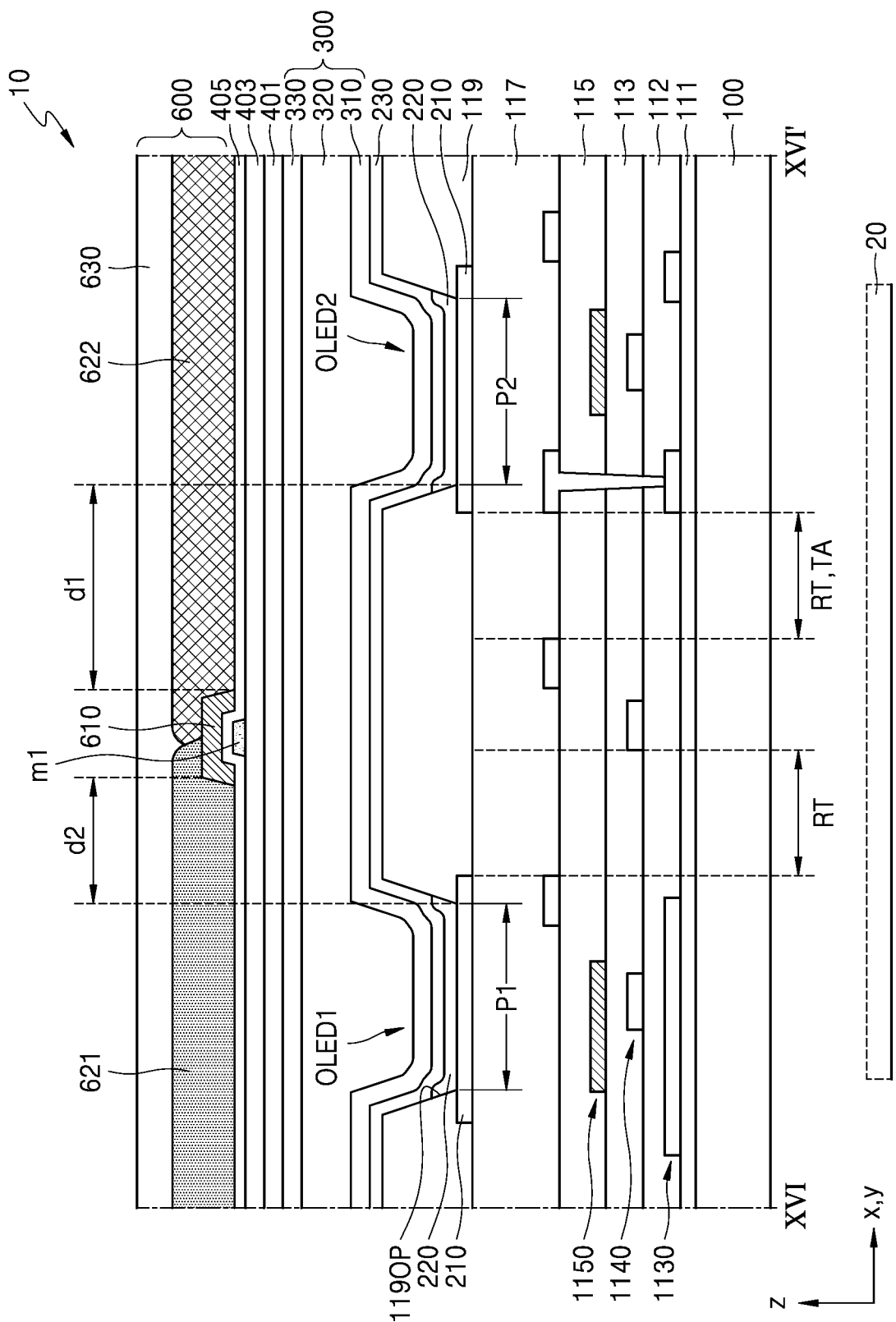
FIG. 16 is a cross-sectional view of the display panel taken along the line XVI-XVI' of FIG. 15.

FIG. 15 is a plan view of the second display area DA2 in the display panel according to an embodiment, and FIG. 16 is a cross-sectional view of the display panel 10 taken along the line XVI-XVI' of FIG. 15.

According to the embodiments described above with reference to FIGS. 10B and 11B, and FIGS. 13 and 14, the first portion 631 of the overcoat layer 630 is in the separation space SS, and thus, the first portion 631 of the overcoat layer 630 is in direct contact with the upper surface of the input sensing layer 400, for example, the upper surface of the third touch insulating layer 405. In another embodiment, the anti-reflection layer 600 may not include the separation space SS.

In some embodiments, when the component 20 located at (e.g., in or on) the second display area DA2 uses light of a wavelength band that passes through at least one of the first to third color filters 621, 622, or 623, the display panel may not include the separation space SS.

In some embodiments, when the component 20 uses the light having a peak wavelength of about 550 nm, the light may pass through the second color filter 622 having the green color from among the first to third color filters 621, 622, and 623. The transmission area TA may be sufficiently ensured in order to improve the optical efficiency of the component 200, and thus, a size (or width) of the second color filter 622 may be greater than sizes (or widths) of the first and second color filters 621 and 623.

Referring to FIG. 15, the first and second metal lines m1 and m2 included in the touch electrode extend to cross each other, and the first and second metal lines m1 and m2 may overlap with the light-blocking portion 610 having the mesh structure, as described above.

Each of the first to third pixels Pa, Pb, and Pc is in the internal hole 610H that is defined by the light-blocking portion 610 surrounding (e.g., around a periphery of) the corresponding pixel, and a width W610b of the internal hole 610H in which the second pixel Pb is located may be greater than widths W610a and W610c of the internal holes 610H in which the first and third pixels Pa and Pc are located.

The second color filter 622 overlaps with the second pixel Pb, and may entirely cover the internal hole 610H in which the second pixel Pb is located. In addition, edges of the second color filter 622 may overlap with the light-blocking portion 610. A width of the second color filter 622 may be greater than a distance between the edges of the light-blocking portion 610 surrounding (e.g., around a periphery of) the second pixel Pb, or in other words, the width W610b of the internal hole 610H.

A region from one edge of the light-blocking portion 610 surrounding (e.g., around a periphery of) the second pixel Pb to one edge of the second pixel Pb, or in other words, a first distance d1, may be covered by the second color filter 622.

A second distance d2 from one edge of the light-blocking portion 610 surrounding (e.g., around a periphery of) the first pixel Pa to one edge of the first pixel Pa may be less than the first distance d1, and a region having the second distance d2 may be covered by the first color filter 621.

Similarly, a third distance d3 from one edge of the light-blocking portion 610 surrounding (e.g., around a periphery of) the third pixel Pc to one edge of the third pixel Pc may be less than the first distance d1, and a region having the third distance d3 may be covered by the third color filter 623.

According to one or more embodiments of the present disclosure, a sufficient transmittance of light emitted from or proceeding toward the component may be obtained, without degrading an aperture ratio of each pixel at (e.g., in or on) the region where the component is located.

Although some example embodiments have been described, those skilled in the art will readily appreciate that various modifications are possible in the example embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific example embodiments disclosed herein, and that various modifications to the disclosed example embodiments, as well as other example embodiments, are intended to be included within the spirit and scope of the present disclosure as defined in the appended claims, and their equivalents.

What is claimed is:

1. A display panel comprising:
   a first pixel circuit and a second pixel circuit on a substrate, each of the first and second pixel circuits comprising a transistor, a storage capacitor, and a conductive line;
   a first pixel electrode electrically coupled to the first pixel circuit;
   a second pixel electrode adjacent to the first pixel electrode, and electrically coupled to the second pixel circuit;
   a pixel defining layer covering edges of the first pixel electrode and edges of the second pixel electrode, and having openings overlapping with the first and second pixel electrodes, respectively;
   a first emission layer on the first pixel electrode;
   a second emission layer on the second pixel electrode;
   an opposite electrode on the first emission layer and the second emission layer; and
   an anti-reflection layer on the opposite electrode,
   wherein the anti-reflection layer comprises:
   a light-blocking portion corresponding to an area between the opening of the pixel defining layer overlapping with the first pixel electrode and the opening of the pixel defining layer overlapping with the second pixel electrode;
   a first color filter overlapping with the first emission layer;
   a second color filter overlapping with the second emission layer; and
   an overcoat layer over the first and second color filters, the overcoat layer comprising a first portion filled in a separation space between the light-blocking portion and at least one of the first color filter or the second color filter in a plan view, the separation space overlapping with the pixel defining layer, and
   wherein the light-blocking portion is located between the first color filter and the second color filter, and is spaced from the at least one of the first color filter or the second color filter to define the separation space between the light-blocking portion and the at least one of the first color filter or the second color filter in a plan view.

2. The display panel of claim 1, wherein the first portion of the overcoat layer overlaps with the pixel defining layer, and each of the overcoat layer and the pixel defining layer comprises a transparent organic insulating material.

3. The display panel of claim 1, further comprising an input sensing layer between the opposite electrode and the anti-reflection layer,
wherein the first portion of the overcoat layer is in direct contact with an upper surface of the input sensing layer.

4. The display panel of claim 3, wherein the input sensing layer comprises a touch electrode comprising a metal line overlapping with the light-blocking portion.

5. The display panel of claim 4, wherein the input sensing layer further comprises a touch insulating layer between the metal line and the light-blocking portion, the touch insulating layer comprising an inorganic insulating material.

6. The display panel of claim 4, wherein a width of the metal line is less than a width of the light-blocking portion.

7. The display panel of claim 1, further comprising a plurality of insulating layers between the substrate and the pixel defining layer,
wherein a stacked part between a top surface of the substrate and a top surface of the pixel defining layer overlaps with the first portion of the overcoat layer, the stacked part comprising the plurality of insulating layers and the pixel defining layer.

8. The display panel of claim 1, further comprising a first light-emitting diode comprising the first pixel electrode, the first emission layer, and the opposite electrode,
wherein the separation space at least partially surrounds an emission area of the first light-emitting diode in a plan view.

9. An electronic device comprising:
a display panel comprising a first display area, and a second display area; and
a component overlapping with the second display area of the display panel,
wherein the second display area of the display panel comprises:
a substrate;
a first light-emitting diode and a second light-emitting diode adjacent to each other on the substrate;
a pixel defining layer covering edges of a first pixel electrode in the first light-emitting diode and edges of a second pixel electrode in the second light-emitting diode, the pixel defining layer having openings overlapping with the first pixel electrode and the second pixel electrode, respectively;
an encapsulation layer on the first light-emitting diode and the second light-emitting diode; and
an anti-reflection layer on the encapsulation layer,
wherein the anti-reflection layer comprises:
a light-blocking portion between the opening of the pixel defining layer overlapping with the first pixel electrode and the opening of the pixel defining layer overlapping with the second pixel electrode in a plan view;
a first color filter overlapping with the first light-emitting diode;
a second color filter overlapping with the second light-emitting diode; and
an overcoat layer over the first and second color filters, the overcoat layer comprising a first portion filled in a separation space between the light-blocking portion and at least one of the first color filter or the second color filter in a plan view, the separation space overlapping with the pixel defining layer,
wherein the light-blocking portion is located between the first color filter and the second color filter, and is spaced from the at least one of the first color filter or the second color filter to define the separation space between the light-blocking portion and the at least one of the first color filter or the second color filter in a plan view, and
wherein the separation space overlaps with the second display area and the component.

10. The electronic device of claim 9, wherein the first portion of the overcoat layer overlaps with the pixel defining layer, and each of the overcoat layer and the pixel defining layer comprises a transparent organic insulating material.

11. The electronic device of claim 9, further comprising an input sensing layer between the encapsulation layer and the anti-reflection layer, the input sensing layer comprising touch electrodes.

12. The electronic device of claim 11, wherein the first portion of the overcoat layer is in direct contact with an upper surface of the input sensing layer.

13. The electronic device of claim 12, wherein each of the touch electrodes comprises a metal line having a mesh structure, and
the light-blocking portion covers the metal line.

14. The electronic device of claim 13, wherein the input sensing layer further comprises a touch insulating layer between the metal line and the light-blocking portion, the touch insulating layer comprising an inorganic insulating material.

15. The electronic device of claim 9, further comprising a plurality of insulating layers between the substrate and the pixel defining layer,
wherein a stacked part between a top surface of the substrate and a top surface of the pixel defining layer overlaps with the first portion of the overcoat layer, the stacked part comprising the plurality of insulating layers and the pixel defining layer.

16. The electronic device of claim 9, wherein a number of light-emitting diodes at the first display area is equal to a number of light-emitting diodes at the second display area for the same sized unit area.

17. The display panel of claim 1, wherein a thickness of the first portion of the overcoat layer is greater than a thickness of a second portion of the overcoat layer that overlaps with the at least one of the first color filter or the second color filter.

18. The electronic device of claim 9, wherein a thickness of the first portion of the overcoat layer is greater than a thickness of a second portion of the overcoat layer that overlaps with the at least one of the first color filter or the second color filter.

* * * * *